US012796395B2

(12) United States Patent
Naoda et al.

(10) Patent No.: US 12,796,395 B2
(45) Date of Patent: Nov. 10, 2026

(54) PROTECTIVE SHEET FOR SEMICONDUCTOR PROCESSING, AND METHOD FOR MANUFACTURING SEMICONDUCTOR DEVICE

(71) Applicant: Resonac Corporation, Tokyo (JP)

(72) Inventors: Koji Naoda, Tokyo (JP); Keita Yumoto, Tokyo (JP); Kazuhiro Sasaki, Tokyo (JP)

(73) Assignee: Resonac Corporation, Tokyo (JP)

( * ) Notice: Subject to any disclaimer, the term of this patent is extended or adjusted under 35 U.S.C. 154(b) by 232 days.

(21) Appl. No.: 18/851,831

(22) PCT Filed: Jul. 21, 2023

(86) PCT No.: PCT/JP2023/026777
§ 371 (c)(1),
(2) Date: Sep. 27, 2024

(87) PCT Pub. No.: WO2024/038732
PCT Pub. Date: Feb. 22, 2024

(65) Prior Publication Data

US 2025/0210403 A1 Jun. 26, 2025

(51) Int. Cl.

| | |
|---|---|
| ***B32B 7/12*** | (2006.01) |
| ***B32B 27/30*** | (2006.01) |
| ***H10P 72/70*** | (2026.01) |

(52) U.S. Cl.
CPC ............ *H10P 72/7402* (2026.01); *B32B 7/12* (2013.01); *B32B 27/308* (2013.01); *B32B 2307/584* (2013.01); *B32B 2307/7376* (2023.05); *B32B 2457/14* (2013.01); *Y10T 428/2848* (2015.01); *Y10T 428/287* (2015.01); *Y10T 428/2891* (2015.01)

(58) Field of Classification Search
None
See application file for complete search history.

(56) References Cited

U.S. PATENT DOCUMENTS

| | | | | |
|---|---|---|---|---|
| 6,524,701 | B1 * | 2/2003 | Kondo | B32B 27/36 428/355 R |
| 2003/0064579 | A1 * | 4/2003 | Miyakawa | C09J 7/29 438/643 |
| 2005/0031861 | A1 * | 2/2005 | Matsumura | C09J 7/29 156/154 |
| 2009/0221215 | A1 * | 9/2009 | Kawashima | C09J 7/29 428/343 |
| 2021/0277288 | A1 * | 9/2021 | Teshiba | C09J 7/38 |

FOREIGN PATENT DOCUMENTS

| | | | |
|---|---|---|---|
| JP | 2017-092122 | A | 5/2017 |
| JP | 2021-163785 | A | 10/2021 |
| JP | 2022-109375 | A | 7/2022 |
| WO | 2015/111310 | A1 | 7/2015 |

* cited by examiner

*Primary Examiner* — Anish P Desai
(74) *Attorney, Agent, or Firm* — Sughrue Mion, PLLC

(57) ABSTRACT

A protective sheet for semiconductor processing includes a substrate, and an intermediate layer and an adhesive layer in this order on one main surface of the substrate. The intermediate layer is a cured product of a resin composition comprising a (meth)acrylic resin (A1) not containing an ethylenically unsaturated group, and a crosslinking agent (B1), and the adhesive layer is a cured product of an adhesive composition comprising a specific ethylenically unsaturated group-containing (meth)acrylic resin (A2), a crosslinking agent (B2), and a photopolymerization initiator (C). The (meth)acrylic resin (A1) not containing an ethylenically unsaturated group has a plurality of functional groups that react with functional groups of the crosslinking agent (B1), and the ethylenically unsaturated group-containing (meth)acrylic resin (A2) has a plurality of functional groups that react with functional groups of the crosslinking agent (B2).

12 Claims, 1 Drawing Sheet

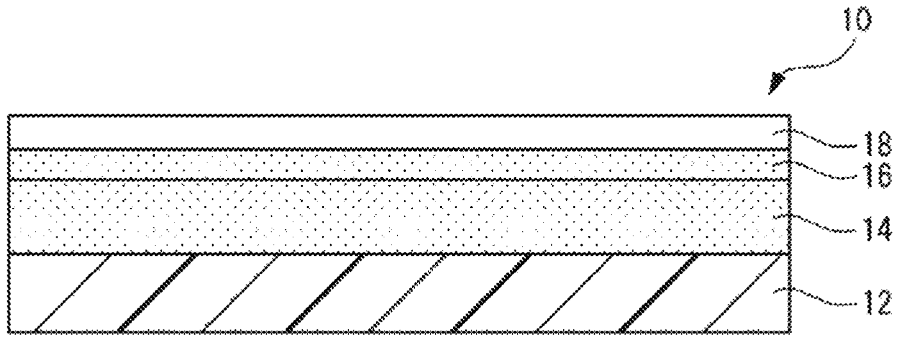
10
18
16
14
12

PROTECTIVE SHEET FOR SEMICONDUCTOR PROCESSING, AND METHOD FOR MANUFACTURING SEMICONDUCTOR DEVICE

CROSS REFERENCE TO RELATED APPLICATIONS

This application is a National Stage of International Application No. PCT/JP2023/026777 filed Jul. 21, 2023, claiming priority based on International Application No. PCT/JP2022/030891 filed Aug. 15, 2022.

TECHNICAL FIELD

The content of the present disclosure relates to a protective sheet for semiconductor processing and a method for manufacturing a semiconductor device.

BACKGROUND ART

Various protective sheets are used in manufacturing processes of semiconductors. Specific examples thereof include a protective sheet (back grinding tape) for protecting a semiconductor wafer in a step of back grinding the semiconductor wafer, and a fixing sheet (dicing tape) used in a step of cutting and separating (dicing) a semiconductor wafer into small element pieces. These protective sheets are removable protective sheets which are attached to a semiconductor wafer that is an adherend and are peeled off from the adherend after a predetermined processing step has been completed.

In recent years, along with miniaturization and high-density packaging of electronic devices, flip-chip mounting is becoming mainstream as a method capable of mounting a semiconductor element in a minimum area. In flip-chip mounting, a semiconductor chip (e.g., a through silicon via (TSV) chip) including a protruding electrode (bump) having a tip portion made of solder is used for bonding between chips. This semiconductor chip with bumps is subjected to a reflow process through which the semiconductor chip and another semiconductor chip or a substrate are heated up to a temperature equal to or higher than the melting temperature of solder (normally 200° C. or higher) and electrically connected and mounted. Incidentally, in a case where a semiconductor chip is mounted on an electronic device for communication, a communication failure may occur due to electromagnetic waves generated from the inside of the chip. In order to prevent this, a sputtering process through which a metal film as an electromagnetic wave shield is deposited on the outer peripheral portion of the semiconductor chip is carried out (usually at 150° C. or higher) in some cases. In the reflow process and the sputtering process, a removable protective sheet is used to protect the bump surface.

For example, PTL 1 describes a method for producing an electronic device using an electronic component having a circuit forming surface and an adhesive lamination film including a substrate layer, an unevenness absorbent resin layer, and an adhesive resin layer in this order.

CITATION LIST

Patent Literature

PTL 1: JP 2021-163785 A

SUMMARY OF INVENTION

Technical Problem

Because a semiconductor chip with bumps and a printed circuit board (PCB) with bumps include a large uneven shape on the surface thereof, the protective sheet is required to accurately conform to and be in close contact with the uneven shape while serving a function of surface protection in a processing step and the like. Moreover, the protective sheet is required to have high heat resistance. If the heat resistance is poor, there arise issues such as an occurrence of lifting from the adherend due to outgas generated from the protective sheet during a high-temperature treatment such as a reflow process and a sputtering process, and an occurrence of adhesive residue left on the adherend at the time when the protective sheet is peeled off.

However, known protective sheets were not configured to satisfy all of the above-mentioned conditions. For example, in PTL 1, there have been cases where a resin in the unevenness absorbent resin layer was flew out due to insufficient heat resistance during the heating step, or an adhesive residue on the semiconductor chip remained when peeling off the protective sheet.

The present disclosure provides a protective sheet for semiconductor processing that can accurately conform to and be in close contact with unevenness on a surface of a semiconductor device having unevenness on the surface, such as a semiconductor chip with bumps or a PCB with bumps, through various processing steps, and that can be peeled off without leaving any adhesive residue after irradiation with active energy rays. In particular, there is provided a protective sheet for semiconductor processing that can accurately conform to and be in close contact with unevenness on a surface of an adherend, and that can be peeled off without leaving any adhesive residue after irradiation with active energy rays, even when the step height (bump height) of the unevenness on the surface of the adherend is large and even when undergoing a process of treatment at high temperature, such as 200° C. Furthermore, a method for manufacturing a semiconductor device with the protective sheet for semiconductor processing can be provided.

Solution to Problem

The content of the present disclosure includes the following aspects.

[1]

A protective sheet for semiconductor processing, including: a substrate; and an intermediate layer and an adhesive layer in this order on one main surface of the substrate,

- the intermediate layer being a cured product of a resin composition containing an ethylenically unsaturated group-free (meth)acrylic resin (A1) and a crosslinking agent (B1), and
- the adhesive layer being a cured product of an adhesive composition containing an ethylenically unsaturated group-containing (meth)acrylic resin (A2), a crosslinking agent (B2), and a photopolymerization initiator (C),
- wherein the ethylenically unsaturated group-free (meth) acrylic resin (A1) has a plurality of functional groups that reacts with a functional group included in the crosslinking agent (B1),
- the ethylenically unsaturated group-containing (meth) acrylic resin (A2) has a plurality of functional groups that reacts with a functional group included in the crosslinking agent (B2), and the ethylenically unsaturated group-containing (meth)acrylic resin (A2) is an adduct of an epoxy group-containing ethylenically unsaturated compound (a2-3) to a copolymer of a monomer group (M2) that contains an alkyl (meth)acrylate (a2-1) and a carboxy group-containing ethylenically unsaturated compound (a2-2).

[2]

The protective sheet for semiconductor processing according to aspect [1], wherein the intermediate layer has a thickness of from 30 to 600 μm, the adhesive layer has a thickness of from 5 to 100 m, and a thickness ratio between the intermediate layer and the adhesive layer (intermediate layer/adhesive layer) is from 1 to 50.

[3]

The protective sheet for semiconductor processing according to aspect [1] or [2], wherein the ethylenically unsaturated group-free (meth)acrylic resin (A1) has a glass transition temperature (Tg) of from −80 to 0° C.

[4]

The protective sheet for semiconductor processing according to any of aspects [1] to [3], wherein the ethylenically unsaturated group-free (meth)acrylic resin (A1) is a copolymer of a monomer group (M1) containing an alkyl (meth)acrylate (a1-1) and a hydroxy group-containing (meth)acrylate (a1-2), and the crosslinking agent (B1) is an isocyanate crosslinking agent.

[5]

The protective sheet for semiconductor processing according to aspect [4], wherein the monomer group (M1) further contains a carboxy group-containing ethylenically unsaturated compound (a1-3).

[6]

The protective sheet for semiconductor processing according to aspect [4] or [5], wherein the monomer group (M1) further contains a (meth)acrylamide compound.

[7]

The protective sheet for semiconductor processing according to any of aspects [1] to [6], wherein the ethylenically unsaturated group-containing (meth)acrylic resin (A2) has a glass transition temperature (Tg) of from −80 to 0° C.

[8]

The protective sheet for semiconductor processing according to any of aspects [1] to [7], wherein the ethylenically unsaturated group-containing (meth)acrylic resin (A2) has an ethylenically unsaturated group equivalent of from 100 to 4000 g/mol.

[9]

The protective sheet for semiconductor processing according to any of aspects [1] to [8], wherein the crosslinking agent (B2) is an epoxy crosslinking agent.

[10]

A method for manufacturing a semiconductor device having a bump electrode, the method including:

a protection step of attaching a surface of the adhesive layer of the protective sheet for semiconductor processing according to any of aspects [1] to [9] to a surface with a bump electrode of the semiconductor device;

an active energy ray irradiation step of irradiating the protective sheet for semiconductor processing with an active energy ray to photo-cure the adhesive layer;

a heating step of heating the semiconductor device having the protective sheet for semiconductor processing attached; and a peeling step of peeling the protective sheet for semiconductor processing off from the surface with a bump electrode.

[11]

The method for manufacturing a semiconductor device according to aspect [10], wherein when a height of the bump electrode is denoted by H [μm] and a total thickness of the intermediate layer and the adhesive layer is denoted by d [μm], d/H is from 0.40 to 110.

[12]

The method for manufacturing a semiconductor device according to aspect [10] or [11], wherein a maximum attained temperature in the heating step is from 100 to 230° C.

Advantageous Effects of Invention

According to the present disclosure, a protective sheet for semiconductor processing can be provided that can accurately conform to and be in close contact with unevenness on a surface of an adherend, and that can be peeled off without leaving any adhesive residue after irradiation with active energy rays, even when the step height (bump height) of the unevenness on the surface of the adherend is large and even when undergoing a treatment at high temperature, such as 200° C. Furthermore, a method for manufacturing a semiconductor device with this protective sheet for semiconductor processing can be provided.

According to the present disclosure, an active energy ray irradiation reduces the adhesive force of the adhesive layer included in the protective sheet for semiconductor processing. Specifically, the adhesive layer exhibits a sufficient adhesive force to an adherend before being irradiated with an active energy ray, and unsaturated bonds in the resin form a three-dimensional crosslinked structure and the adhesive layer is cured after being irradiated with an active energy ray, thereby the adhesive force is reduced and the adhesive layer exhibits excellent release property, and an adhesive residue on the adherend after peeling off can be adequately prevented.

BRIEF DESCRIPTION OF DRAWINGS

The FIGURE is a schematic cross-sectional view of a protective sheet for semiconductor processing according to one embodiment.

DESCRIPTION OF EMBODIMENTS

Hereinafter, embodiments of the present invention will be described in detail. However, the present invention is not limited to the embodiments described below.

In the present specification, when "to" is used for a numerical range, the numerical values at the endpoints on the right and on the left of the interval thereof are an upper limit value and a lower limit value, respectively, and are included in the numerical range.

In the present disclosure, the term "(meth)acrylic" means "acrylic" or "methacrylic". The term "(meth)acrylate" means "acrylate" or "methacrylate", and the term "(meth)acryloyloxy" means "acryloyloxy" or "methacryloyloxy".

In the present disclosure, the "weight-average molecular weight (Mw)" is a value measured using gel permeation chromatography (GPC) at normal temperature (23° C.) under the following conditions, and determined using a standard polystyrene calibration curve.

Apparatus: Shodex (trademark) GPC-101 (Showa Denko K.K.)

Column: Shodex (trademark) LF-804 (Showa Denko K.K.)

Column temperature: 40° C.

Sample: 0.2% by mass solution of a sample in tetrahydrofuran

Flow rate: 1 mL/min

Eluent: tetrahydrofuran

Detector: RI detector

In the present disclosure, the glass transition temperature (Tg) of the (meth)acrylic resin means a value determined by converting a glass transition temperature Tga at an absolute temperature determined using FOX formula (Fox, T. G., Bull. Am. Phys. Soc., 1 (1956), p. 123) of the following formula (1) into a Celsius temperature.

$$1/Tga=\Sigma i(Wi/Tgi) \quad (1)$$

wherein, in the formula (1), Tga represents the glass transition temperature (unit is absolute temperature) of the (meth)acrylic resin. Wi is a mass ratio of each monomer i in the (meth)acrylic resin. Tgi is the glass transition temperature (unit is absolute temperature) of the homopolymer formed only from each monomer i.

In the present disclosure, the "acid value (mgKOH/g)" is a value measured according to JIS K 0070: 1992.

In the present disclosure, the "hydroxyl value (mgKOH/g)" is a value measured according to JIS K 0070:1992.

In the present disclosure, the "ethylenically unsaturated group equivalent (g/mol)" is a value calculated from an iodine value measured according to JIS K 0070:1992.

<Protective Sheet for Semiconductor Processing>

A protective sheet for semiconductor processing according to one embodiment includes a substrate, and an intermediate layer and an adhesive layer on one main surface of the substrate in this order. The protective sheet for semiconductor processing includes the intermediate layer that has an appropriate hardness and the adhesive layer that is photocurable, and thereby even when the step height (bump height) of unevenness on a surface of an adherend is large, and even when undergoing a process of treatment at high temperature, such as 200° C., the protective sheet for semiconductor processing can accurately conform to and be in close contact with the unevenness of the surface, and can be peeled off without leaving any adhesive residue after irradiation with active energy rays. The FIGURE is a schematic cross-sectional view of a protective sheet for semiconductor processing in one embodiment. The protective sheet for semiconductor processing 10 includes a substrate 12, an intermediate layer 14 disposed on one main surface (upper side in the FIGURE) of the substrate 12, and an adhesive layer 16 disposed on the intermediate layer 14. The protective sheet for semiconductor processing 10 may further include a release sheet (separator) 18 disposed on the adhesive layer 16, as necessary. The release sheet is attached to the outside of the adhesive layer for the purpose of protecting the surface of the adhesive layer (attachment surface to an adherend) until the protective sheet for semiconductor processing is used. The protective sheet for semiconductor processing can be suitably used as, for example, a back grinding tape and a dicing tape.

The protective sheet for semiconductor processing may be used as a protective sheet for semiconductor processing which is formed into a shape corresponding to the shape of an adherend by a punching method or the like. The protective sheet for semiconductor processing may be wound and cut and thereby used as a roll-shape protective sheet for semiconductor processing.

The thickness of the protective sheet for semiconductor processing varies depending on the step height (bump height) of unevenness on a surface of an adherend, but is preferably from 60 μm to 1600 μm, more preferably from 100 μm to 650 μm, and still more preferably from 120 μm to 550 μm. From a point of view of more reliably conforming to the unevenness of the surface of the adherend and securing the processing accuracy of the adherend during the processing step, the thickness of the protective sheet for semiconductor processing is preferably about from 1.5 to 3 times as thick as the step height of the unevenness of the surface of the adherend.

The peel strength of the protective sheet for semiconductor processing varies depending on the thickness of the protective sheet for semiconductor processing, the type of the adherend, and the type and the order of the processing steps, but for example, the peel strength before an active energy ray irradiation is preferably from 2.0 to 25 N/25 mm, more preferably from 3.0 to 20 N/25 mm, and still more preferably from 5.0 to 15 N/25 mm. When the peel strength before an active energy ray irradiation is 2.0 N/25 mm or more, the adhesion to the adherend before an active energy ray irradiation is good. When the peel strength before an active energy ray irradiation is 25 N/25 mm or less, the peel strength at the time of peeling can be adequately reduced, and the adhesive residue on the adherend can be reduced.

The protective sheet for semiconductor processing of one embodiment has a reduced peel strength by an active energy ray irradiation, and the protective sheet can be easily peeled off from the adherend without leaving any adhesive residue in the peeling step. The peel strength of the protective sheet for semiconductor processing after an active energy ray irradiation varies depending on the thicknesses of the protective sheet for semiconductor processing, the types of adherends, and the type and the order of processing steps, but is, for example, preferably from 0.001 to 1.0 N/25 mm, more preferably from 0.005 to 0.75 N/25 mm, and still more preferably from 0.01 to 0.5 N/25 mm.

Note that as used in the present disclosure, the peel strength is a measured value of the peel strength (N/25 mm) of the protective sheet for semiconductor processing to an adherend, which is obtained by carrying out a tensile test in a 180° direction at a peeling rate of 300 mm/min under an environment at a temperature of 23° C. and a humidity of 50% according to JIS Z 0237:2009.

[Substrate]

As the substrate, a known sheet-like material can be appropriately selected and used. As the substrate, a resin sheet produced by using a transparent resin material is preferably used.

Examples of the resin material include polyesters, such as polyethylene terephthalate (PET), polybutylene terephthalate (PBT), and polyethylene naphthalate (PEN); polyetheretherketone (PEEK); polyamide (PA); polyimide (PI); polyphenylene sulfide (PPS); and polytetrafluoroethylene (PTFE). Among these resin materials, PET, PEN, PEEK, PA, or PI is preferably used, PEN, PET, or PA is more preferably used, and PA is still more preferably used because a sheet having appropriate flexibility and heat resistance can be obtained. When these are used, the resin sheet is less likely to be damaged, even when the resin sheet is subjected to a treatment at high temperature such as a reflow process and a sputtering process. The resin materials may be used singly, or a mixture of two or more types thereof may be used.

When a resin sheet is used as the substrate, the resin sheet may have a single layer or a multilayer structure including two or more layers (e.g., a three-layer structure). In the resin sheet having a multilayer structure, the resin material included in each layer may be one type or two or more types.

The thickness of the substrate can be appropriately selected according to the type of semiconductor processing, the material of the substrate, and the like. When the protective sheet for semiconductor processing is configured for protecting a semiconductor chip with bumps or a flexible printed circuit board (FPC) with bumps in carrying out a reflow process or a sputtering process, and its substrate is a resin sheet, the thickness of the substrate is preferably from 5 to 1000 μm, more preferably from 10 to 300 μm, still more preferably from 20 to 100 μm, and even more preferably from 25 to 50 μm. When the thickness of the substrate is 5 μm or more, the protective sheet for semiconductor processing has high rigidity (high stiffness). Therefore, when the protective sheet for semiconductor processing is attached to an adherend, such as a semiconductor chip or peeled off from the adherend, wrinkles and lifting tend to be less likely to occur in the protective sheet for semiconductor processing. In addition, when the thickness of the substrate is 5 μm or more, workability (handleability, handling) is good and the protective sheet for semiconductor processing attached to an adherend is easily peeled off from the adherend, and the like. When the thickness of the substrate is 1000 μm or less, the rigidity of the protective sheet for semiconductor processing is appropriate, and workability is good.

The thickness of the substrate is preferably 5 μm or more, more preferably 10 μm or more, further preferably 20 μm or more, and still more preferably 25 μm or more from the point of view that the protective sheet for semiconductor processing attached to an adherend is easily peeled off from the adherend. From a point of view of the rigidity of the protective sheet for semiconductor processing, the thickness is preferably 1000 μm or less, more preferably 300 μm or less, further preferably 100 μm or less, and still more preferably 50 μm or less. Any combination of these lower and upper limits is acceptable.

When a resin sheet is used as the substrate, the above-mentioned resin material is used and a known typical sheet forming method (e.g., extrusion molding, T-die molding, inflation molding, uniaxial or biaxial stretching molding, etc.) can be appropriately adopted to produce the substrate.

The surface of the substrate on the side in contact with the intermediate layer may be subjected to surface treatment for improving adhesiveness between the substrate and the intermediate layer. Examples of the surface treatment include corona discharge treatment, acid treatment, ultraviolet irradiation treatment, plasma treatment, and undercoating agent (primer) coating.

[Intermediate Layer]

The intermediate layer is a cured product of a resin composition containing an ethylenically unsaturated group-free (meth)acrylic resin (A1) and a crosslinking agent (B1). The cured product is a reaction product (crosslinked product) of a functional group included in the crosslinking agent (B1) and a functional group that is included in the ethylenically unsaturated group-free (meth)acrylic resin (A1) and is a functional group capable of reacting with the functional group included in the crosslinking agent (B1). Since the protective sheet for semiconductor processing has the intermediate layer, the protective sheet has a good conformability to step height, even when the step height (bump height) on the surface of the adherend is large.

The thickness of the intermediate layer is preferably from 30 to 600 μm, more preferably from 50 to 500 μm, still more preferably from 80 to 300 μm, and even more preferably from 100 to 200 μm. When the thickness of the intermediate layer is 30 μm or more, the protective sheet for semiconductor processing has a good conformability to step height on the surface of an adherend. When the thickness of the intermediate layer is 600 μm or less, the processing accuracy in the processing step of an adherend is good.

The thickness of the intermediate layer is preferably 30 μm or more, more preferably 50 μm or more, still more preferably 80 μm or more, and even more preferably 100 μm or more from a point of view of the conformability of the protective sheet for semiconductor processing to step height on the surface of an adherend. From a point of view of processing accuracy in the processing step of an adherend, the thickness of the intermediate layer is preferably 600 μm or less, more preferably 500 μm or less, still more preferably 300 μm or less, and even more preferably 200 μm or less. Any combination of these lower and upper limits is acceptable.

(Ethylenically Unsaturated Group-Free (meth)acrylic Resins (A1))

The ethylenically unsaturated group-free (meth)acrylic resin (A1) is not particularly limited as long as it has an ethylenically unsaturated group equivalent of more than 4000 g/mol or it has no ethylenically unsaturated group, and has a plurality of functional groups that is reactive with a functional group included in the crosslinking agent (B1). In one embodiment, the ethylenically unsaturated group-free (meth)acrylic resin (A1) contains no ethylenically unsaturated group. Examples of the functional group that is reactive with the functional group of the crosslinking agent (B1) include a hydroxy group, a carboxy group, an isocyanato group, a glycidyl group, an amino group, and an amide group. The ethylenically unsaturated group-free (meth) acrylic resin (A1) may be used singly, or two or more types thereof may be used in combination. When the intermediate layer is formed by using the ethylenically unsaturated group-free (meth)acrylic resin (A1), the protective sheet for semiconductor processing has high heat resistance, and also has high conformability to unevenness of an adherend, even when exposed to a high temperature condition from an attachment step to the adherend to a processing step and a peeling step. In addition, the protective sheet for semiconductor processing has a good conformability to step height, even when the step height (bump height) on the surface of the adherend is large.

The glass transition temperature (Tg) of the ethylenically unsaturated group-free (meth)acrylic resin (A1) is preferably −80° C. or higher, more preferably −70° C. or higher, and still more preferably −60° C. or higher. The glass transition temperature (Tg) of the ethylenically unsaturated group-free (meth)acrylic resin (A1) is preferably 0° C. or lower, more preferably −10° C. or lower, and still more preferably −20° C. or lower. Any combination of these lower and upper limits is acceptable. The glass transition temperature (Tg) of the ethylenically unsaturated group-free (meth) acrylic resin (A1) is preferably from −80° C. to 0° C., more preferably from −70° C. to −10° C., and still more preferably from −60° C. to −20° C. When the glass transition temperature is −80° C. or higher, an intermediate layer having high cohesive strength is obtained, so that liquation of the resin can be prevented at the time when forming a sheet. When the glass transition temperature is 0° C. or lower, adhesion between the intermediate layer and the adhesive layer is further improved.

The weight-average molecular weight of the ethylenically unsaturated group-free (meth)acrylic resin (A1) is preferably from 100,000 to 2,000,000, more preferably from 150,000 to 1,500,000, and still more preferably from 200,000 to 1,000,000. When the weight-average molecular weight is 100,000 or more, an intermediate layer having high cohesive strength can be obtained, and liquation of the resin can be prevented at the time when forming a sheet. When the weight-average molecular weight is 2,000,000 or less, forming and processing are easy.

As described below, as the crosslinking agent (B1), for example, a crosslinking agent such as an isocyanate crosslinking agent and an epoxy crosslinking agent can be used.

In an embodiment in which the crosslinking agent (B1) is an isocyanate crosslinking agent, the ethylenically unsaturated group-free (meth)acrylic resin (A1) is preferably a copolymer of a monomer group (M1) that contains an alkyl (meth)acrylate (a1-1) and a hydroxy group-containing (meth)acrylate (a1-2). The monomer group (M1) may further contain as necessary at least one selected from the group consisting of a carboxy group-containing ethylenically unsaturated compound (a1-3) and other monomers (a1-4).

In this embodiment, the hydroxyl value of the ethylenically unsaturated group-free (meth)acrylic resin (A1) is preferably from 0.5 to 100 mgKOH/g, more preferably from 1 to 50 mgKOH/g, and still more preferably from 5 to 30 mgKOH/g. When the hydroxyl value is 0.5 mgKOH/g or more, the ethylenically unsaturated group-free (meth)acrylic resin (A1) can adequately react with the isocyanate crosslinking agent, and an intermediate layer having high cohesive strength is obtained. When the hydroxyl value is 100 mgKOH/g or less, a resulting resin is soluble in a commonly used organic solvent, such as ethyl acetate and toluene, and thus handling is easy.

In this embodiment, the content of the alkyl (meth)acrylate (a1-1) in the monomer group (M1) constituting the ethylenically unsaturated group-free (meth)acrylic resin (A1) is preferably from 50 to 95 mol %, more preferably from 60 to 90 mol %, and still more preferably from 70 to 90 mol %. When the content of the alkyl (meth)acrylate (a1-1) is 50 mol % or more, the adhesion of the intermediate layer to the substrate and the adhesive layer is good. When the content of the alkyl (meth)acrylate (a1-1) is 95 mol % or less, the content of the hydroxy group-containing (meth)acrylate (a1-2) can be adequately ensured, so that the amount of crosslinking with the crosslinking agent (B1) is adequately ensured, and the cohesive strength of the intermediate layer is enhanced.

In this embodiment, the content of the hydroxy group-containing (meth)acrylate (a1-2) in the monomer group (M1) constituting the ethylenically unsaturated group-free (meth)acrylic resin (A1) is preferably from 0.5 to 30 mol %, more preferably from 1.0 to 20 mol %, and still more preferably from 1.5 to 10 mol %. When the content of the hydroxy group-containing (meth)acrylate (a1-2) is 0.5 mol % or more, the amount of crosslinking with the crosslinking agent (B1) is adequately ensured, and the cohesive strength of the intermediate layer is enhanced. When the content of the hydroxy group-containing (meth)acrylate (a1-2) is 30 mol % or less, a resulting resin is soluble in a commonly used organic solvent, such as ethyl acetate and toluene, and thus handling is easy.

In this embodiment, when the monomer group (M1) constituting the ethylenically unsaturated group-free (meth)acrylic resin (A1) contains the carboxy group-containing ethylenically unsaturated compound (a1-3), the content thereof is preferably from 0.01 to 10 mol %, more preferably from 0.05 to 5 mol %, and still more preferably from 0.1 to 3 mol %. When the content of the carboxy group-containing ethylenically unsaturated compound (a1-3) is 0.01 mol % or more, the cohesive strength of the intermediate layer is excellent. When the content of the carboxy group-containing ethylenically unsaturated compound (a1-3) is 10 mol % or less, the cohesive strength of a resulting resin is not excessively high, and thus handling is easy.

In this embodiment, when the monomer group (M1) constituting the ethylenically unsaturated group-free (meth)acrylic resin (A1) contains the other monomers (a1-4), the content thereof is preferably from 0.5 to 30 mol %, more preferably from 1.0 to 25 mol %, and still more preferably from 5 to 15 mol %.

The alkyl (meth)acrylate (a1-1) is not particularly limited as long as it is a compound having no functional group such as a hydroxy group or a carboxy group and having an alkyl group and a (meth)acryloyloxy group. Specific examples thereof include linear or branched alkyl (meth)acrylates, such as methyl (meth)acrylate, ethyl (meth)acrylate, n-propyl (meth)acrylate, n-butyl (meth)acrylate, tert-butyl (meth)acrylate, isobutyl (meth)acrylate, 2-ethylhexyl (meth)acrylate, isodecyl (meth)acrylate, n-hexyl (meth)acrylate, isooctyl (meth)acrylate, and lauryl (meth)acrylate; and cyclic alkyl group-containing (meth)acrylates, such as cyclohexyl (meth)acrylate, isobornyl (meth)acrylate, dicyclopentanyl (meth)acrylate, and dicyclopentanyloxyethyl (meth)acrylate. Among these, methyl (meth)acrylate, ethyl (meth)acrylate, n-butyl (meth)acrylate, 2-ethylhexyl (meth)acrylate, and isooctyl (meth)acrylate are preferable. From a point of view of ease of synthesis, it is preferable to use a linear or branched alkyl (meth)acrylate having an alkyl group with from 1 to 20 carbon atoms, and it is more preferable to use a linear or branched alkyl (meth)acrylate having an alkyl group with from 1 to 12 carbon atoms. From a point of view of heat resistance, a cyclic alkyl group-containing (meth)acrylate having a cyclic alkyl group with from 3 to 30 carbon atoms is preferable. The alkyl (meth)acrylate (a1-1) may be used singly, or two or more types thereof may be used in combination.

The hydroxy group-containing (meth)acrylate (a1-2) is not particularly limited as long as it is a compound having a hydroxy group and a (meth)acryloyloxy group. Specific examples thereof include 2-hydroxyethyl (meth)acrylate, 2-hydroxypropyl (meth)acrylate, 4-hydroxybutyl (meth)acrylate, 1,3-butanediol (meth)acrylate, 1,4-butanediol (meth)acrylate, 1,6-hexanediol (meth)acrylate, and 3-methylpentanediol (meth)acrylate. The hydroxy group-containing (meth)acrylate (a1-2) may be used singly, or two or more types thereof may be used in combination.

The carboxy group-containing ethylenically unsaturated compound (a1-3) is not particularly limited as long as it is a compound having no hydroxy group and having a carboxy group and a (meth)acryloyloxy group. When the monomer group (M1) constituting the ethylenically unsaturated group-free (meth)acrylic resin (A1) contains the carboxy group-containing ethylenically unsaturated compound (a1-3), the cohesive strength is enhanced based on reasons such as the crosslinking that occurs between a carboxy group derived from the carboxy group-containing ethylenically unsaturated compound (a1-3) and a hydroxy group derived from the hydroxy group-containing (meth)acrylate (a1-2) at the time when the intermediate layer is formed. Moreover, when the adhesive layer also contains a carboxy group, interlayer adhesion between the adhesive layer and the intermediate layer is also enhanced. Furthermore, the crosslinking agent (B2) in the adhesive layer is preferably an epoxy crosslinking agent, because the crosslinking of carboxy groups derived from the carboxy group-containing ethylenically unsaturated compound (a1-3) via the epoxy crosslinking agent in the adhesive layer proceeds at the interface between the adhesive layer and the intermediate layer thereby giving stronger interlayer adhesion.

Specific examples of the carboxy group-containing ethylenically unsaturated compound (a1-3) include (meth) acrylic acid, carboxymethyl (meth)acrylate, and β-carboxyethyl (meth)acrylate. The carboxy group-containing ethylenically unsaturated compound (a1-3) may be used singly, or two or more types thereof may be used in combination.

The other monomers (a1-4) are not particularly limited as long as they are a compound other than (a1-1) to (a1-3) and have an ethylenically unsaturated group copolymerizable with (a1-1) to (a1-3). Examples thereof include alkoxyalkyl (meth)acrylates, alkoxy (poly)alkylene glycol (meth)acrylates, aromatic group-containing (meth)acrylates, fluorinated alkyl (meth)acrylates, dialkylaminoalkyl (meth)acrylates, and (meth)acrylamide compounds. The other monomers (a1-4) may be used singly, or two or more types thereof may be used in combination.

Examples of the alkoxyalkyl (meth)acrylate include ethoxyethyl (meth)acrylate, methoxyethyl (meth)acrylate, and butoxyethyl (meth)acrylate.

Examples of the alkoxy (poly)alkylene glycol (meth) acrylate include methoxydiethylene glycol (meth)acrylate, ethoxydiethylene glycol (meth)acrylate, 2-methoxyethoxyethyl (meth)acrylate, and methoxydipropylene glycol (meth) acrylate.

Examples of the aromatic group-containing (meth)acrylate include benzyl (meth)acrylate, phenoxyethyl (meth) acrylate, phenoxydiethylene glycol (meth)acrylate, 3-phenoxyphenyl acrylate, 4-phenoxyphenyl acrylate, 2-biphenyl acrylate, 4-biphenyl acrylate, phenoxypolyethylene glycol (meth)acrylate, phenoxypropyl (meth)acrylate, and phenoxypolypropylene glycol (meth)acrylate.

Examples of the fluorinated alkyl (meth)acrylate include octafluoropentyl (meth)acrylate.

Examples of the dialkylaminoalkyl (meth)acrylate include N,N-dimethylaminoethyl (meth)acrylate and N,N-diethylaminoethyl (meth)acrylate.

Examples of the (meth)acrylamide compound include (meth)acrylamide; N-alkyl (meth)acrylamides, such as N-methyl (meth)acrylamide, N-ethyl (meth)acrylamide, N-propyl (meth)acrylamide, N-isopropylacrylamide, and N-hexyl (meth)acrylamide; N,N-dialkyl (meth)acrylamide, such as N,N-dimethyl (meth)acrylamide and N,N-diethyl (meth)acrylamide; (meth)acryloylmorpholine; and diacetone acrylamide.

Other specific examples of the other monomers (a1-4) include acrylonitrile, methacrylonitrile, styrene, α-methylstyrene, vinyl acetate, vinyl propionate, vinyl stearate, vinyl chloride, vinylidene chloride, alkyl vinyl ether, vinyl toluene, N-vinylpyridine, N-vinylpyrrolidone, itaconic acid dialkyl ester, fumaric acid dialkyl ester, allyl alcohol, hydroxybutyl vinyl ether, hydroxyethyl vinyl ether, 4-hydroxymethyl cyclohexyl methyl vinyl ether, triethylene glycol monovinyl ether, diethylene glycol monovinyl ether, methyl vinyl ketone, allyl trimethyl ammonium chloride, and dimethyl allyl vinyl ketone.

Among them, from a point of view of improving adhesion to an adherend, a (meth)acrylamide compound is preferable, N,N-dialkyl (meth)acrylamide is more preferable, and N,N-dimethyl (meth)acrylamide is still more preferable.

In one embodiment in which the crosslinking agent (B1) is an epoxy crosslinking agent, the ethylenically unsaturated group-free (meth)acrylic resin (A1) is preferably a copolymer of a monomer group (M1) containing an alkyl (meth) acrylate (a1-1) and a carboxy group-containing ethylenically unsaturated compound (a1-3). The monomer group (M1) may further contain as necessary at least one selected from the group consisting of hydroxy group-containing (meth) acrylate (a1-2) and other monomers (a1-4).

In this embodiment, as (a1-1) to (a1-4), those similar to those described above can be used.

In this embodiment, the content of the alkyl (meth) acrylate (a1-1) in the monomer group (M1) constituting the ethylenically unsaturated group-free (meth)acrylic resin (A1) is preferably from 50 to 99.0 mol %, more preferably from 60 to 99.0 mol %, and still more preferably from 70 to 99.0 mol %. When the content of the alkyl (meth)acrylate (a1-1) is 50 mol % or more, the adhesion of the intermediate layer to the substrate and the adhesive layer is good. When the content of the alkyl (meth)acrylate (a1-1) is 99.0 mol % or less, the content of the hydroxy group-containing (meth) acrylate (a1-2) and the content of the carboxy group-containing ethylenically unsaturated compound (a1-3) can be adequately ensured, so that the amount of crosslinking with the crosslinking agent (B1) is satisfactorily ensured, and the cohesive strength of the intermediate layer is enhanced.

In this embodiment, the content of the carboxy group-containing ethylenically unsaturated compound (a1-3) in the monomer group (M1) constituting the ethylenically unsaturated group-free (meth)acrylic resin (A1) is preferably from 0.1 to 30 mol %, more preferably from 0.1 to 20 mol %, and still more preferably from 0.1 to 10 mol %. When the content of the carboxy group-containing ethylenically unsaturated compound (a1-3) is 0.1 mol % or more, the cohesive strength of the intermediate layer is excellent. When the content of the carboxy group-containing ethylenically unsaturated compound (a1-3) is 30 mol % or less, the cohesive strength of a resulting resin is not excessively high, and handling is easy.

In this embodiment, when the monomer group (M1) constituting the ethylenically unsaturated group-free (meth) acrylic resin (A1) contains the hydroxy group-containing (meth)acrylate (a1-2), the content thereof is preferably from 0.1 to 30 mol %, more preferably from 0.1 to 20 mol %, and still more preferably from 0.1 to 10 mol %. When the content of the hydroxy group-containing (meth)acrylate (a1-2) is 0.1 mol % or more, the amount of crosslinking with the crosslinking agent (B1) can be adequately ensured. When the content of the hydroxy group-containing (meth)acrylate (a1-2) is 30 mol % or less, a resulting resin is soluble in a commonly used organic solvent, such as ethyl acetate and toluene, and thus handling is easy.

In this embodiment, the content of the other monomers (a1-4) in the monomer group (M1) constituting the ethylenically unsaturated group-free (meth)acrylic resin (A1) is preferably from 0 to 45 mol %, more preferably from 0 to 35 mol %, and still more preferably from 0.1 to 25 mol %.

(Crosslinking Agent (B1))

The crosslinking agent (B1) is not particularly limited as long as it is a compound having a plurality of functional groups capable of reacting with any of the plurality of functional groups included in the ethylenically unsaturated group-free (meth)acrylic resin (A1), and can be selected in accordance with the functional groups included in the ethylenically unsaturated group-free (meth)acrylic resin (A1). For example, when the ethylenically unsaturated group-free (meth)acrylic resin (A1) has a hydroxy group, it is preferable to use an isocyanate crosslinking agent or an epoxy crosslinking agent as the crosslinking agent (B1), and it is more preferable to use an isocyanate crosslinking agent as the crosslinking agent (B1). When the ethylenically unsaturated group-free (meth)acrylic resin (A1) has a carboxy group, an isocyanate crosslinking agent, an epoxy crosslinking agent, or an aziridine crosslinking agent is preferably used as the crosslinking agent (B1), and an epoxy crosslinking agent is more preferably used as the crosslinking agent (B1). When the intermediate layer contains the crosslinking agent (B1), the cohesive strength of the intermediate layer is enhanced, and the adhesive residue can be reduced when the protective sheet for semiconductor processing is peeled off from an adherend. The crosslinking agent (B1) may be used singly, or two or more types thereof may be used in combination.

Examples of a preferable combination of the ethylenically unsaturated group-free (meth)acrylic resin (A1) and the crosslinking agent (B1) include a combination of an ethylenically unsaturated group-free (meth)acrylic resin (A1) having a hydroxy group and an isocyanate crosslinking agent, a combination of an ethylenically unsaturated group-free (meth)acrylic resin (A1) having a carboxy group and an epoxy crosslinking agent, and a combination of an ethylenically unsaturated group-free (meth)acrylic resin (A1) having a carboxy group and an aziridine crosslinking agent, and a combination of an ethylenically unsaturated group-free (meth)acrylic resin (A1) having a hydroxy group and an isocyanate crosslinking agent is more preferable.

The isocyanate crosslinking agent is a compound having two or more isocyanato groups. Examples thereof include 2,4-tolylene diisocyanate, 2,6-tolylene diisocyanate, hydrogenated tolylene diisocyanate, 1,3-xylylene diisocyanate, 1,4-xylylene diisocyanate, diphenylmethane-4,4'-diisocyanate, isophorone diisocyanate, 1,3-bis(isocyanatomethyl)cyclohexane, an isocyanurate of hexamethylene diisocyanate, tetramethylxylylene diisocyanate, 1,5-naphthalene diisocyanate, a tolylene diisocyanate adduct of trimethylolpropane, a xylylene diisocyanate adduct of trimethylolpropane, triphenylmethane triisocyanate, and methylenebis(4-phenylmethane)triisocyanate. Among them, an isocyanurate of hexamethylene diisocyanate and a tolylene diisocyanate adduct of trimethylolpropane are preferable. The isocyanate crosslinking agents may be used singly, or two or more types thereof may be used in combination.

The epoxy crosslinking agent is a compound having two or more epoxy groups. Examples thereof include 1,3-bis(N,N'-diglycidylaminomethyl)cyclohexane, a bisphenol A-epichlorohydrin type epoxy resin, N,N'-[1,3-phenylenebis(methylene)]bis[bis(oxirane-2-ylmethyl)amine], ethylene glycol diglycidyl ether, polyethylene glycol diglycidyl ether, glycerin diglycidyl ether, glycerin triglycidyl ether, 1,6-hexanediol diglycidyl ether, trimethylolpropane triglycidyl ether, sorbitol polyglycidyl ether, polyglycerol polyglycidyl ether, pentaerythritol polyglycidyl ether, diglycerol polyglycidyl ether, and both-end epoxy-modified polydimethylsiloxane. The epoxy crosslinking agent may be used singly, or two or more types thereof may be used in combination.

The aziridine crosslinking agent is a compound having two or more aziridinyl groups. Examples thereof include ethylene glycol-bis-[3-(2-aziridinyl)propionate], trimethylolpropane-tris[3-(2-aziridinyl)propionate], trimethylolpropane-tris[3-(1-aziridinyl)propionate], trimethylolpropane-tris[3-(2-methyl-1-aziridinyl)propionate], tetramethylolmethane-tris[3-(2-aziridinyl)propionate], pentaerythritol-tris[3-(1-aziridinyl)propionate], N,N'-diphenylmethane-4,4'-bis(1-aziridinecarboxamide), N,N'-hexamethylene-1,6-bis(1-aziridinecarboxamide), tris-2,4,6-(1-aziridinyl)-1,3,5-triazine, tris(1-aziridinyl)phosphine oxide, and 2,2-bis(hydroxymethyl)butanol-tris[3-(1-aziridinyl)propionate]. The aziridine crosslinking agents may be used singly, or two or more types thereof may be used in combination.

The content of the crosslinking agent (B1) is preferably from 0.05 to 30 parts by mass, more preferably from 0.1 to 20 parts by mass, and still more preferably from 0.1 to 10 parts by mass, per 100 parts by mass of the ethylenically unsaturated group-free (meth)acrylic resin (A1). When the content of the crosslinking agent (B1) is 0.05 parts by mass or more, a three-dimensional crosslinked structure is adequately formed in the intermediate layer, and as a result, an intermediate layer having high heat resistance is obtained. When the content of the crosslinking agent (B1) is 30 parts by mass or less, an appropriate gelation time can be ensured at the time when forming a sheet.

(Other Components)

The resin composition may contain components other than the above-described ethylenically unsaturated group-free (meth)acrylic resin (A1) and the crosslinking agent (B1), as necessary. Examples of the other components include a tackifier, a solvent, and various additives.

<<Tackifier>>

As the tackifier, a known tackifier can be used without particular limitation. Examples of the tackifier include a terpene-based tackifier resin, a phenol-based tackifier resin, a rosin-based tackifier resin, an aliphatic petroleum resin, an aromatic petroleum resin, a copolymer petroleum resin, an alicyclic petroleum resin, a xylene resin, an epoxy-based tackifier resin, a polyamide-based tackifier resin, a ketone-based tackifier resin, and an elastomer-based tackifier resin. The tackifier may be used singly, or two or more types thereof may be used in combination.

When the resin composition contains a tackifier, the content thereof is preferably 30 parts by mass or less, and more preferably from 5 to 20 parts by mass, per 100 parts by mass of the ethylenically unsaturated group-free (meth)acrylic resin (A1).

<<Solvent>>

The solvent can be used to dilute the resin composition for the purpose of adjusting the viscosity of the resin composition. For example, when applying the resin composition, a solvent can be used to adjust the viscosity of the resin composition to an appropriate viscosity. The solvent is removed at the time when the intermediate layer is formed.

Examples of the solvent that can be used include organic solvents, such as methyl ethyl ketone, methyl isobutyl ketone, acetone, ethyl acetate, propyl acetate, tetrahydrofuran, dioxane, cyclohexanone, hexane, toluene, xylene, n-propanol, and isopropyl alcohol. The solvent may be used singly, or two or more types thereof may be used in combination.

<<Additives>>

Examples of the additives include plasticizers, surface lubricants, leveling agents, softeners, antioxidants, antiaging agents, light stabilizers, ultraviolet absorbers, polymerization inhibitors, light stabilizers, such as a benzotriazole-based compound, phosphoric acid ester-based and other flame retardants, surfactants, and antistatic agents.

[Method for Producing Ethylenically Unsaturated Group-Free (meth)acrylic Resin (A1)]

The method for producing the ethylenically unsaturated group-free (meth)acrylic resin (A1) is not particularly limited. The ethylenically unsaturated group-free (meth)acrylic resin (A1) can be obtained, for example, by copolymerizing the monomer group (M1) by a known polymerization method. Specific examples of polymerization method that can be used include a solution polymerization method, an emulsion polymerization method, a bulk polymerization method, a suspension polymerization method, and an alternating copolymerization method. Among these polymerization methods, a solution polymerization method is preferably used in terms of ease of reaction.

When the ethylenically unsaturated group-free (meth)acrylic resin (A1) is produced by a solution polymerization method, a radical polymerization initiator is used, as necessary.

The radical polymerization initiator is not particularly limited, and can be appropriately selected from known initiators and used. Examples of the radical polymerization initiator include oil-soluble polymerization initiators, such as azo polymerization initiators including 2,2'-azobis(isobutyronitrile), 2,2'-azobis(4-methoxy-2,4-dimethylvaleronitrile), 2,2'-azobis(2,4-dimethylvaleronitrile), 2,2'-azobis(2-methylbutyronitrile), 1,1'-azobis(cyclohexane-1-carbonitrile), 2,2'-azobis(2,4,4-trimethylpentane), and dimethyl-2,2'-azobis(2-methylpropionate); and peroxide-based polymerization initiators including benzoyl peroxide, t-butyl hydroperoxide, di-t-butyl peroxide, t-butyl peroxybenzoate, dicumyl peroxide, 1,1-bis(t-butylperoxy)-3,3,5-trimethylcyclohexane, and 1,1-bis(t-butylperoxy)cyclododecane.

The radical polymerization initiator may be used singly, or two or more types thereof may be used in combination.

The amount of the radical polymerization initiator used is preferably from 0.01 to 5 parts by mass, more preferably from 0.02 to 4 parts by mass, and still more preferably from 0.03 to 3 parts by mass, per 100 parts by mass of the monomer group (M1).

As the solvent used during producing the ethylenically unsaturated group-free (meth)acrylic resin (A1) by a solution polymerization method, a common solvent can be used. Examples of the solvent include esters, such as ethyl acetate, propyl acetate, and butyl acetate; aromatic hydrocarbons, such as toluene, xylene, and benzene; aliphatic hydrocarbons, such as hexane and heptane; cycloaliphatic hydrocarbons, such as cyclohexane and methylcyclohexane; ketones, such as methyl ethyl ketone and methyl isobutyl ketone; glycols, such as ethylene glycol, propylene glycol, and dipropylene glycol; glycol ethers, such as methyl cellosolve, propylene glycol monomethyl ether, and dipropylene glycol monomethyl ether; and glycol esters, such as ethylene glycol diacetate and propylene glycol monomethyl ether acetate.

The solvents may be used singly, or two or more types thereof may be used in combination.

[Method for Producing Resin Composition]

The resin composition can be produced by a known method. For example, the resin composition can be produced by using a known method through which the ethylenically unsaturated group-free (meth)acrylic resin (A1), the crosslinking agent (B1), and other components to be contained as necessary, such as a tackifier, a solvent, and various additives, are mixed and stirred.

The method for mixing and stirring the components to be contained in the resin composition is not particularly limited. The mixing and stirring can be carried out by using, for example, a homogenizing disper or an agitator equipped with a stirring blade, such as a paddle blade.

[Method for Producing Intermediate Layer]

The intermediate layer can be produced, for example, by the following method. First, a resin composition is applied onto a substrate, and when a solvent is contained, the solvent is removed by heat-drying, to form an uncured intermediate layer. Thereafter, a release sheet is attached onto the uncured intermediate layer as necessary until immediately before an adhesive layer or an uncured adhesive layer is stacked onto the uncured intermediate layer. In the uncured intermediate layer, a crosslinked structure may be formed by carrying out curing reaction through heat curing the obtained sheet in an oven or the like for a certain period of time. The curing reaction may be carried out after the uncured intermediate layer has been attached to the uncured adhesive layer.

The intermediate layer can also be produced by the following method. A resin composition is applied onto a release sheet, and when a solvent is contained, the solvent is removed by heat-drying, to form an uncured intermediate layer. Thereafter, the release sheet having the uncured intermediate layer is placed on the substrate so the surface on the side of the uncured intermediate layer as to face the substrate, and the intermediate layer is transferred onto (migrates to) the substrate. The resultant sheet may be treated as described above to form a crosslinked structure.

As a method for applying the resin composition onto the substrate (or onto the release sheet), a known method can be used. Specific examples of the method include a method in which coating is carried out with a common use coater, such as a gravure roll coater, a reverse roll coater, a kiss roll coater, a dip roll coater, a bar coater, a knife coater, a spray coater, a comma coater, or a direct coater.

The conditions for heat-drying the applied resin composition are not particularly limited, but the heat-drying are carried out usually at a temperature of from 25 to 180° C., and preferably from 60 to 150° C., and usually for a period of time from 1 to 20 minutes, and preferably from 1 to 10 minutes. When the heat-drying are carried out under the abovementioned conditions, the solvent contained in the resin composition can be removed. The reaction conditions for curing (crosslinking) the uncured intermediate layer after the heat-drying are not particularly limited, but are usually at a temperature of from 25 to 100° C., and preferably from 30 to 80° C., and usually for a period of time from 1 to 14 days, and preferably from 1 to 7 days. When the curing reaction is carried out under the above conditions, the ethylenically unsaturated group-free (meth)acrylic resin (A1) and the crosslinking agent (B1) can be crosslinked, thereby the gel fraction of the intermediate layer can be adjusted to be within a desired range.

(Release Sheet (Separator))

As the release sheet, a known sheet-like material can be appropriately selected and used. As the release sheet, those similar to the above-described resin sheet that is used as the substrate can be used.

The thickness of the release sheet can be appropriately selected according to the material of the release sheet and the like. When a resin sheet is used as the release sheet, the thickness of the release sheet is preferably from 5 to 300 μm, more preferably from 10 to 200 μm, and still more preferably from 25 to 100 μm.

The release surface (surface disposed in contact with the intermediate layer) of the release sheet may be subjected to a release treatment with a known release agent, such as a silicone-based release agent, a long-chain alkyl-based release agent, or a fluorine-based release agent, as necessary.

[Adhesive Layer]

The adhesive layer is a cured product of an adhesive composition that contains an ethylenically unsaturated group-containing (meth)acrylic resin (A2), a crosslinking agent (B2), and a photopolymerization initiator (C). The cured product is a reaction product (crosslinked product) of a functional group included in the crosslinking agent (B2)

and a functional group that is included in the ethylenically unsaturated group-containing (meth)acrylic resin (A2) and is a functional group capable of reacting with the functional group included in the crosslinking agent (B2), and is not a photo-cured product by the photopolymerization initiator (C). In the adhesive layer, the photopolymerization initiator (C) is decomposed by an active energy ray irradiation, such as an ultraviolet ray irradiation, thereby radical polymerization of an ethylenically unsaturated group included in the ethylenically unsaturated group-containing (meth)acrylic resin (A2) is initiated, and a further crosslinked structure is formed (photo-cured). The protective sheet for semiconductor processing has the adhesive layer, and thus it has good adhesion to an adherend without occurrence of lifting, even when undergoing various processing steps in a state of being attached to the adherend. Moreover, after the processing steps have been completed, the peel strength of the adhesive layer is reduced by an active energy ray irradiation, so that the adhesive layer can be peeled off from the adherend without leaving any adhesive residue.

The thickness of the adhesive layer is preferably 5 μm or more, more preferably 10 μm or more, and still more preferably 15 μm or more. The thickness of the adhesive layer is preferably 100 μm or less, more preferably 50 μm or less, and still more preferably 30 μm or less. Any combination of these lower and upper limits is acceptable. The thickness of the adhesive layer is preferably from 5 to 100 μm, more preferably from 10 to 50 μm, and still more preferably from 15 to 30 μm. When the thickness of the adhesive layer is 5 μm or more, adhesion to an adherend is good. When the thickness of the adhesive layer is 100 μm or less, the occurrence of adhesive residues can be suppressed.

The thickness ratio between the intermediate layer and the adhesive layer (intermediate layer/adhesive layer) is preferably from 1 to 50, more preferably from 1 to 40, still more preferably from 1 to 30, and even more preferably from 1 to 10. When the thickness ratio is within the ranges set forth above, both conformability to unevenness and heat resistance can be achieved.

(Ethylenically Unsaturated Group-Containing (meth)acrylic Resin (A2))

The ethylenically unsaturated group-containing (meth) acrylic resin (A2) is not particularly limited as long as it is an adduct of an epoxy group-containing ethylenically unsaturated compound (a2-3) to a copolymer of a monomer group (M2) that contains an alkyl (meth)acrylate (a2-1) and a carboxy group-containing ethylenically unsaturated compound (a2-2). The ethylenically unsaturated group-containing (meth)acrylic resin (A2) may be used singly, or two or more types thereof may be used in combination. When the adhesive layer is formed by using the ethylenically unsaturated group-containing (meth)acrylic resin (A2) that is an adduct of the epoxy group-containing ethylenically unsaturated compound (a2-3) to the (meth)acrylic copolymer having a carboxy group, the protective sheet for semiconductor processing has high heat resistance, and maintains high conformability to unevenness of an adherend, even when exposed to a high temperature condition from an attachment step to the adherend to a processing step and a peeling step. Moreover, at the time when the protective sheet for semiconductor processing is peeled off from the adherend after the processing step, an excellent release property can be provided by an active energy ray irradiation.

The glass transition temperature (Tg) of the ethylenically unsaturated group-containing (meth)acrylic resin (A2) is preferably −80° C. or higher, more preferably −70° C. or higher, and still more preferably −60° C. or higher. The glass transition temperature (Tg) of the ethylenically unsaturated group-containing (meth)acrylic resin (A2) is preferably 0° C. or lower, more preferably −10° C. or lower, and still more preferably −20° C. or lower. Any combination of these lower and upper limits is acceptable. The glass transition temperature (Tg) of the ethylenically unsaturated group-containing (meth)acrylic resin (A2) is preferably from −80° C. to 0° C., more preferably from −70° C. to −10° C., and still more preferably from −60° C. to −20° C. When the glass transition temperature is −80° C. or higher, an adhesive layer having high cohesive strength is obtained, so that liquation of the resin can be prevented at the time when forming a sheet. When the glass transition temperature is 0° C. or lower, adhesion between the intermediate layer and the adhesive layer is further improved.

The weight-average molecular weight of the ethylenically unsaturated group-containing (meth)acrylic resin (A2) is preferably from 100,000 to 2,000,000, more preferably from 150,000 to 1,500,000, and still more preferably from 200,000 to 1,000,000. When the weight-average molecular weight is 100,000 or more, an adhesive layer having high cohesive strength is obtained, and liquation of a resin can be prevented at the time when forming a sheet. When the weight-average molecular weight is 2,000,000 or less, forming and processing are easy.

The ethylenically unsaturated group equivalent of the ethylenically unsaturated group-containing (meth)acrylic resin (A2) is preferably 100 g/mol or more, more preferably 300 g/mol or more, and still more preferably 500 g/mol or more. The ethylenically unsaturated group equivalent of the ethylenically unsaturated group-containing (meth)acrylic resin (A2) is preferably 4000 g/mol or less, more preferably 3000 g/mol or less, and still more preferably 1500 g/mol or less. Any combination of these lower and upper limits is acceptable. The ethylenically unsaturated group equivalent of the ethylenically unsaturated group-containing (meth) acrylic resin (A2) is preferably from 100 to 4000 g/mol, more preferably from 300 to 3000 g/mol, and still more preferably from 500 to 1500 g/mol. When the ethylenically unsaturated group equivalent is within the ranges set forth above, sufficient curability can be imparted. In addition, pickup performance after UV irradiation is improved.

The acid value of the ethylenically unsaturated group-containing (meth)acrylic resin (A2) is preferably from 1 to 100 mgKOH/g, more preferably from 5 to 75 mgKOH/g, and still more preferably from 10 to 50 mgKOH/g. When the acid value is 1 mgKOH/g or more, the ethylenically unsaturated group-containing (meth)acrylic resin (A2) can adequately react with the epoxy crosslinking agent, and an adhesive layer having high cohesive strength is obtained. When the acid value is 100 mgKOH/g or less, the cohesive strength of a resulting resin is not excessively high, and handling is easy.

The content of the alkyl (meth)acrylate (a2-1) in the monomer group (M2) constituting the ethylenically unsaturated group-containing (meth)acrylic resin (A2) is preferably from 50 to 95 mol %, more preferably from 60 to 90 mol %, and still more preferably from 70 to 90 mol %. When the content of the alkyl (meth)acrylate (a2-1) is 50 mol % or more, its adhesion to the intermediate layer is good. When the content of the alkyl (meth)acrylate (a2-1) is 95 mol % or less, the content of the carboxy group-containing ethylenically unsaturated compound (a2-2) can be adequately ensured, so that the amount of crosslinking with the crosslinking agent (B2) is adequately ensured, and the cohesive strength of the adhesive layer is enhanced. Moreover, the amount of introduction of the ethylenically unsaturated group can be adequately ensured, and hence the peel strength of the protective sheet for semiconductor processing can be adequately reduced upon irradiated with active energy rays.

The content of the carboxy group-containing ethylenically unsaturated compound (a2-2) in the monomer group (M2) constituting the ethylenically unsaturated group-containing (meth)acrylic resin (A2) is preferably from 1 to 50 mol %, more preferably from 5 to 40 mol %, and still more preferably from 10 to 30 mol %. When the content of the carboxy group-containing ethylenically unsaturated compound (a2-2) is 1 mol % or more, the amount of crosslinking with the crosslinking agent (B2) is adequately ensured, so that the cohesive strength of the adhesive layer is enhanced. Moreover, the amount of introduction of the ethylenically unsaturated group can be adequately ensured, and hence the peel strength of the protective sheet for semiconductor processing can be adequately reduced upon irradiated with active energy rays.

The blending amount of the epoxy group-containing ethylenically unsaturated compound (a2-3) is preferably from 1 to 40 mol, more preferably from 3 to 30 mol, and still more preferably from 8 to 25 mol, per 100 mol of the monomer group (M2). The addition ratio of the epoxy group-containing ethylenically unsaturated compound (a2-3) to the carboxy group derived from the carboxy group-containing ethylenically unsaturated compound (a2-2) is preferably from 50 to 99%, more preferably from 65 to 95%, and still more preferably from 70 to 85%. When the addition ratio is within the ranges set forth above, the amount of introduction of the ethylenically unsaturated group can be adequately ensured while ensuring the amount of crosslinking with the crosslinking agent (B2).

The monomer group (M2) may contain other monomers (a2-4) as necessary. The content of the other monomers (a2-4) in the monomer group (M2) constituting the ethylenically unsaturated group-containing (meth)acrylic resin (A2) is preferably from 0 to 45 mol %, more preferably from 0 to 30 mol %, still more preferably from 0 to 10 mol %.

Specific examples and preferable examples of the alkyl (meth)acrylate (a2-1) are similar to those of the alkyl (meth) acrylate (a1-1). The alkyl (meth)acrylate (a2-1) may be used singly, or two or more types thereof may be used in combination. Specific examples and preferable examples of the carboxy group-containing ethylenically unsaturated compound (a2-2) are similar to those of the carboxy group-containing ethylenically unsaturated compound (a1-3). The carboxy group-containing ethylenically unsaturated compound (a2-2) may be used singly, or two or more types thereof may be used in combination.

The epoxy group-containing ethylenically unsaturated compound (a2-3) is not particularly limited as long as it is a compound having no carboxy group and having an epoxy group and an ethylenically unsaturated group. In the present disclosure, the "epoxy group-containing ethylenically unsaturated compound" also includes an ethylenically unsaturated compound that contains an oxetane ring in place of an epoxy group. Specific examples thereof include glycidyl (meth)acrylate, 4-hydroxybutyl (meth)acrylate glycidyl ether, 3,4-epoxycyclohexylmethyl (meth)acrylate, 3,4-epoxycyclohexane-1-carboxylic acid allyl ester, and (3-ethyloxetane-3-yl)methyl (meth)acrylate. Among them, glycidyl (meth)acrylate is preferable from a point of view of ease of synthesis, and 3,4-epoxycyclohexylmethyl (meth) acrylate is preferable from a point of view of heat resistance. The epoxy group-containing ethylenically unsaturated compound (a2-3) may be used singly, or two or more types thereof may be used in combination.

As the other monomers (a2-4) other than (a2-1) and (a2-2), a compound similar to the hydroxy group-containing (meth)acrylate (a1-2) and the other monomers (a1-4) can be used. The other monomers (a2-4) may be used singly, or two or more types thereof may be used in combination.

(Crosslinking Agent (B2))

The crosslinking agent (B2) is not particularly limited as long as it is a compound having a plurality of functional groups capable of reacting with any of the plurality of functional groups included in the ethylenically unsaturated group-containing (meth)acrylic resin (A2). Since the ethylenically unsaturated group-containing (meth)acrylic resin (A2) has a carboxy group, examples of the crosslinking agent (B2) that can be used include epoxy crosslinking agents and aziridine crosslinking agents. When the adhesive layer contains the crosslinking agent (B2), the cohesive strength of the adhesive layer is enhanced, and the adhesive residue can be reduced when the protective sheet for semiconductor processing is peeled off from an adherend. The crosslinking agent (B2) may be used singly, or two or more types thereof may be used in combination.

As the epoxy crosslinking agent and the aziridine crosslinking agent, those similar to the epoxy crosslinking agent and the aziridine crosslinking agent used as the crosslinking agent (B1) can be used. The epoxy crosslinking agent may be used singly, or two or more types thereof may be used in combination. The aziridine crosslinking agents may be used singly, or two or more types thereof may be used in combination.

The content of the crosslinking agent (B2) is preferably from 0.05 to 30 parts by mass, more preferably from 0.1 to 20 parts by mass, and still more preferably from 0.1 to 10 parts by mass, per 100 parts by mass of the ethylenically unsaturated group-containing (meth)acrylic resin (A2). When the content of the crosslinking agent (B2) is 0.05 parts by mass or more, a three-dimensional crosslinked structure is adequately formed in the adhesive layer, and as a result, an adhesive layer having high cohesive strength is obtained. When the content of the crosslinking agent (B2) is 30 parts by mass or less, an appropriate gelation time can be ensured at the time when forming a sheet.

(Photopolymerization Initiator (C))

Examples of the photopolymerization initiator (C) include carbonyl-based photopolymerization initiators, such as benzophenone, benzyl, benzoin, ω-bromoacetophenone, chloroacetone, acetophenone, 2,2-diethoxyacetophenone, 2,2-dimethoxy-2-phenylacetophenone, p-dimethylaminoacetophenone, p-dimethylaminopropiophenone, 2-chlorobenzophenone, 4,4'-dichlorobenzophenone, 4,4'-bisdiethylaminobenzophenone, Michler's ketone, benzoin methyl ether, benzoin isobutyl ether, benzoin-n-butyl ether, benzyl methyl ketal, 1-hydroxycyclohexyl phenyl ketone, 2-hydroxy-2-methyl-1-phenyl-propane-1-one, 1-(4-isopropylphenyl)-2-hydroxy-2-methylpropane-1-one, methyl benzoylformate, 4'-dimethylaminoacetophenone, and 2-methyl-1-[4-(methylthio)phenyl]-2-morpholinopropane-1-one; sulfide-based photopolymerization initiators, such as diphenyl disulfide, dibenzyl disulfide, tetraethylthiuram disulfide, and tetramethylammonium monosulfide; acylphosphine oxide-based photopolymerization initiators, such as 2,4,6-trimethylbenzoyldiphenylphosphine oxide and 2,4,6-trimethylbenzoylphenylethoxyphosphine oxide; quinone-based photopolymerization initiators, such as benzoquinone and anthraquinone; sulfochloride-based photopolymerization initiators; and thioxanthone-based photopolymerization initiators, such as thioxanthone, 2-chlorothioxanthone, and 2-methylthioxanthone.

Among them, a carbonyl-based photopolymerization initiator or an acylphosphine oxide-based photopolymerization initiator is preferably used from a point of view of high sensitivity to ultraviolet rays and heat resistance.

The photopolymerization initiator (C) may be used singly, or two or more types thereof may be used in combination.

The content of the photopolymerization initiator (C) is preferably from 0.1 to 5.0 parts by mass, and more preferably from 0.5 to 2.0 parts by mass, per 100 parts by mass of the ethylenically unsaturated group-containing (meth) acrylic resin (A2). When the content of the photopolymerization initiator (C) is 0.1 parts by mass or more, the adhesive layer can be cured at a sufficiently high curing rate upon irradiation with active energy rays, whereby the peel strength of the adhesive layer after the irradiation with active energy rays can be adequately reduced. When the content of the photopolymerization initiator (C) is 5.0 parts by mass or less, the adhesive layer is less likely to remain on an adherend when the protective sheet for semiconductor processing is peeled off from the adherend. An effect commensurate with the content of the photopolymerization initiator (C) is not exhibited when the content of the photopolymerization initiator (C) is more than 5.0 parts by mass, and therefore the content is adjusted to 5.0 parts by mass or less, so that an adhesive composition can be produced economically.

(Other Components)

The adhesive composition may contain components other than the above-described ethylenically unsaturated group-containing (meth)acrylic resin (A2), the crosslinking agent (B2), and the photopolymerization initiator (C), as necessary. Examples of the other components include a tackifier, a solvent, and various additives. As the tackifier, the solvent, and the various additives, those similar to those described for the resin composition can be used.

[Method for Producing Ethylenically Unsaturated Group-Containing (meth)acrylic Resin (A2)]

The method for producing the ethylenically unsaturated group-containing (meth)acrylic resin (A2) is not particularly limited. The ethylenically unsaturated group-containing (meth)acrylic resin (A2) is obtained, for example, by copolymerizing the monomer group (M2) by a known polymerization method, and then adding the epoxy group-containing ethylenically unsaturated compound (a2-3) to a part of the carboxy groups included in the copolymer.

The copolymer used for producing the ethylenically unsaturated group-containing (meth)acrylic resin (A2) can be obtained by a method similar to the method for producing the ethylenically unsaturated group-free (meth)acrylic resin (A1). Among them, a solution polymerization method is preferable, and the types and the amounts of the radical polymerization initiator used and of the solvent used are also similar to those described for the method for producing the ethylenically unsaturated group-free (meth)acrylic resin (A1).

When a carboxy group-containing copolymer is produced as a copolymer used for producing the ethylenically unsaturated group-containing (meth)acrylic resin (A2), and an epoxy group-containing ethylenically unsaturated compound (a2-3) is added to a part of the carboxy groups, the temperature for the addition reaction is preferably from 80 to 150° C., and particularly preferably from 90 to 130° C. When the temperature for the addition reaction is 80° C. or higher, an adequate reaction rate can be obtained. When the temperature of the addition reaction is 150° C. or lower, generation of a gelled product due to crosslinking of double bond portion through radical polymerization by heat can be prevented.

In the addition reaction, a known catalyst can be used, as necessary. Examples of the catalyst include primary amines, such as n-butylamine, n-hexylamine, benzylamine, diethylenetriamine, triethylenetetramine, and diethylaminopropylamine; tertiary amines, such as triethylamine, tributylamine, dimethylbenzylamine, 1,8-diazabicyclo[5.4.0]undec-7-ene, 1,5-diazabicyclo[4.3.0]non-5-ene, and 1,4-diazabicyclo[2.2.2]octane; aromatic amines, such as aniline, toluidine, phenylenediamine, diaminodiphenylmethane, and 1,8-diaminonaphthalene; pyridine compounds, such as pyridine, 2,6-lutidine, and 4-dimethylaminopyridine; imidazole compounds, such as imidazole, 2-methylimidazole, 2-ethylimidazole, and 2-ethyl-4-methylimidazole; ammonium salts, such as tetramethylammonium chloride, tetramethylammonium bromide, tetrabutylammonium chloride, tetrabutylammonium bromide, tetrabutylammonium iodide, and tetrabutylammonium hydroxide; alkylureas, such as tetramethylurea; alkylguanidines, such as tetramethylguanidine; phosphine compounds, such as triphenylphosphine, dimethylphenylphosphine, tricyclohexylphosphine, tributylphosphine, tris(4-methylphenyl)phosphine, tris(4-methoxyphenyl)phosphine, tris(2,6-dimethylphenyl)phosphine, tris(2,6-dimethoxyphenyl)phosphine, tris(2,4,6-trimethylphenyl)phosphine, and tris(2,4,6-trimethoxyphenyl) phosphine; and phosphonium salts, such as tetraphenylphosphonium chloride, tetraphenylphosphonium bromide, tetraphenylphosphonium iodide, tetraphenylphosphonium tetraphenylborate, tetraphenylphosphonium tetrakispentafluorophenylborate, 4-hydroxyphenyl-2-(triphenylphosphonium)phenolate, and 4-hydroxyphenyl-2-{tris-(4-methylphenyl)phosphonium}phenolate. Among them, a pyridine compound, an imidazole compound, an ammonium salt, a phosphine compound, or a phosphonium salt is preferably used from a point of view of reactivity.

The amount of the catalyst used in the addition reaction is preferably from 0.01 to 20 parts by mass, more preferably from 0.05 to 10 parts by mass, and still more preferably from 0.1 to 5 parts by mass, per 100 parts by mass of the sum of the copolymer and the epoxy group-containing ethylenically unsaturated compound (a2-3).

Furthermore, at the time of the addition reaction, a gas able to inhibit polymerization may be introduced into the reaction system, or a polymerization inhibitor may be added. When the gas able to inhibit polymerization is introduced into the reaction system or the polymerization inhibitor is added, gelation during the addition reaction can be prevented.

As the gas able to inhibit polymerization, mention may be made of a gas that contains oxygen to the extent that does not fall within the explosion range of the substance in the system, and examples thereof include air.

As the polymerization inhibitor, a known polymerization inhibitor can be used. The polymerization inhibitor is not particularly limited, and examples thereof include 4-methoxyphenol, hydroquinone, methoquinone, 2,6-di-t-butylphenol, 2,2'-methylenebis(4-methyl-6-t-butylphenol), and phenothiazine. The polymerization inhibitors may be used singly, or two or more types thereof may be used in combination.

The amount of the polymerization inhibitor used is preferably from 0.005 to 5 parts by mass, more preferably from 0.03 to 3 parts by mass, and still more preferably from 0.05 to 1.5 parts by mass, per 100 parts by mass of the sum of the copolymer and the epoxy group-containing ethylenically unsaturated compound (a2-3). When the amount of the polymerization inhibitor used is 0.005 parts by mass or more, gelation during the addition reaction can be prevented. In contrast, when the amount of the polymerization inhibitor used is 5 parts by mass or less, an adhesive layer with satisfactory exposure sensitivity upon irradiation with active energy rays can be obtained.

Combined use of a gas able to inhibit a polymerization and a polymerization inhibitor is more preferable because the amount of the polymerization inhibitor to be used can be reduced or the effect to inhibit polymerization can be enhanced.

[Method for Producing Adhesive Composition]

The adhesive composition can be produced by a known method. For example, the adhesive composition can be produced by using a known method through which the ethylenically unsaturated group-containing (meth)acrylic resin (A2), the crosslinking agent (B2), the photopolymerization initiator (C), and other components to be contained as necessary, such as a tackifier, a solvent, and various additives, are mixed and stirred.

The method for mixing and stirring the components to be contained in the adhesive composition is not particularly limited. The mixing and stirring can be carried out by using, for example, a homogenizing disper or an agitator equipped with a stirring blade, such as a paddle blade.

[Method for Producing Adhesive Layer]

The adhesive layer can be produced, for example, by the following method. First, an adhesive composition is applied onto a release sheet, and when a solvent is contained, the solvent is removed by heat-drying, to form an uncured adhesive layer. Thereafter, if necessary, a release sheet may be attached to a surface of the uncured adhesive layer on the side to be attached to the intermediate layer or on the side to be attached to the uncured intermediate layer until immediately before the adhesive layer is stacked onto the intermediate layer or onto the uncured intermediate layer. In the uncured adhesive layer, a crosslinked structure may be formed by carrying out curing reaction through heat curing the obtained sheet in an oven or the like for a certain period of time. The curing reaction may be carried out after the uncured intermediate layer has been attached to the uncured adhesive layer.

The adhesive layer can also be produced by the following method. An adhesive composition is directly applied onto an intermediate layer of a sheet having the intermediate layer on one main surface of a substrate, and when a solvent is contained, the solvent is removed by heat-drying, to form an uncured adhesive layer. Thereafter, a release sheet is attached onto the uncured adhesive layer, as necessary. The resultant sheet may be treated as described above to form a crosslinked structure. Alternatively, an adhesive composition may be directly applied onto an uncured intermediate layer of a sheet having the uncured intermediate layer on one main surface of a substrate, and when a solvent is contained, the solvent is removed by heat-drying, to form the uncured adhesive layer. Thereafter, a release sheet is attached onto the uncured adhesive layer as necessary, and then the uncured intermediate layer and the uncured adhesive layer are simultaneously cured. In the case of these methods, the step in which the intermediate layer is attached to the adhesive layer to provide the protective sheet for semiconductor processing can be omitted.

The method for applying the adhesive composition onto the release sheet (or onto the intermediate layer or onto the uncured intermediate layer), the conditions and preferred ranges for heat-drying the applied adhesive composition, and the conditions and preferred ranges for curing the uncured adhesive layer after heat-drying in an oven for a certain period of time are similar to those described for the method for producing the intermediate layer.

(Release Sheet (Separator))

As the release sheet, a known sheet-like material can be appropriately selected and used. As the release sheet, those similar to the above-described resin sheet that is used as the substrate can be used.

The thickness of the release sheet can be appropriately selected according to the intended use of the protective sheet for semiconductor processing, the material of the release sheet, and the like. When a resin sheet is used as the release sheet, the thickness of the release sheet is preferably from 5 to 300 μm, more preferably from 10 to 200 μm, and still more preferably from 25 to 100 μm.

The release surface (surface disposed in contact with the adhesive layer) of the release sheet may be subjected to a release treatment with a known release agent, such as a silicone-based release agent, a long-chain alkyl-based release agent, or a fluorine-based release agent, as necessary.

[Method for Manufacturing Protective Sheet for Semiconductor Processing]

One example of an embodiment of a method for manufacturing a protective sheet for semiconductor processing will be described below. There are prepared a sheet having an uncured intermediate layer on one main surface of a substrate and a sheet having an uncured adhesive layer on a release sheet. When a release sheet is stacked on the attachment surface of both sheets, this release sheet is peeled off, and the attachment surface (surface opposite to the substrate) of the uncured intermediate layer and the attachment surface (surface opposite to the release sheet) of the uncured adhesive layer are attached to each other with the two attachment surfaces facing each other.

Thereafter, the uncured intermediate layer and the uncured adhesive layer in a state of being attached to each other are heated in an oven for a certain period of time (curing step), and the uncured intermediate layer and the uncured adhesive layer are thermally cured to provide a cured product of both layers. The conditions for the curing step are not particularly limited, but curing is carried out usually at a temperature ranging from 30 to 100° C., and preferably from 40 to 80° C., and usually for a period of time ranging from 1 to 14 days, and preferably from 1 to 7 days. When curing is carried out under the above-mentioned conditions, the ethylenically unsaturated group-free (meth) acrylic resin (A1) and the crosslinking agent (B1) in the intermediate layer can be crosslinked, as well as the ethylenically unsaturated group-containing (meth)acrylic resin (A2) and the crosslinking agent (B2) in the adhesive layer can be crosslinked and the gel fraction of each layer can be adjusted to be within a desired range. Depending on the combination of the components, progress of crosslinking at the interface between the intermediate layer and the adhesive layer, that is, crosslinking of (A1) and (B2) and crosslinking of (A2) and (B1) can also be expected, and therefore interlayer adhesion between the intermediate layer and the adhesive layer is also expected to be improved through the curing step.

Besides the above-mentioned method, there are also a method in which either an uncured intermediate layer or an uncured adhesive layer is cured first, and then the other uncured layer is attached thereto and the uncured layer is cured, and a method in which an intermediate layer (as a cured product) and an adhesive layer (as a cured product) are attached to each other.

[Method for Manufacturing Semiconductor Device Having Bump Electrode]

A method for manufacturing a semiconductor device having a bump electrode according to one embodiment comprises a protection step of attaching a surface of an adhesive layer of a protective sheet for semiconductor processing to a surface with a bump electrode of a semiconductor device;

an active energy ray irradiation step of irradiating the protective sheet for semiconductor processing with an active energy ray to photo cure the adhesive layer;

a heating step of heating the semiconductor device having the protective sheet for semiconductor processing attached; and a peeling step of peeling the protective sheet for semiconductor processing off from the surface with a bump electrode. Note that, a processing step may be carried out between the protection step and the peeling step, and the order of the other steps may be changed as long as the protection step is carried out first and the peeling step is carried out last.

(Protection Step)

In the protection step, the surface of the adhesive layer of the protective sheet for semiconductor processing is attached to the surface with a bump electrode of the semiconductor device having a bump electrode. This protects the surface with a bump electrode of the semiconductor device. Specific examples of the semiconductor device include semiconductor devices having unevenness on the surface, such as a semiconductor chip with bumps, a printed circuit board with bumps (PCB), and a flexible printed circuit board with bumps (FPC). These semiconductor devices are subjected to various processing steps in manufacturing steps up to a mounting step in which a bump electrode is connected to another electronic device. When the surface with a bump electrode is protected during the processing step, damage, breakage, contamination, and the like of the surface with a bump electrode can be prevented. The protective sheet for semiconductor processing can also serve as a function of temporarily fixing a semiconductor device for carrying out the subsequent processing step.

When the height of the bump electrode is denoted by H [μm] and the total thickness of the intermediate layer and the adhesive layer is denoted by d [μm], d/H is preferably from 0.40 to 110, more preferably from 1.00 to 100, still more preferably from 1.10 to 20, and still more preferably from 1.25 to 10.

When the height of the bump electrode is denoted by H [μm] and the total thickness of the intermediate layer and the adhesive layer is denoted by d [μm], d/H is preferably 0.40 or more, more preferably 1.00 or more, still more preferably 1.10 or more, and still more preferably 1.25 or more. It is preferable that d/H is 110 or less, d/H is more preferably 100 or less, still more preferably 20 or less, still more preferably 10 or less, and particularly preferably 5.0 or less. Any combination of these lower and upper limits is acceptable.

When a release sheet is provided on the adhesive layer, the release sheet can protect the adhesive layer until use. When the release sheet is provided on the adhesive layer, an operation can be efficiently carried out in which the release sheet is peeled off to expose the adhesive layer and the adhesive layer (attachment surface) is pressed to the surface with a bump electrode of the semiconductor device.

When the semiconductor device has a plurality of surfaces with bump electrodes, a protective sheet for semiconductor processing is attached to some or all of the surfaces with bump electrodes in the protection step. For example, in the case of stacking semiconductor chips disclosed in JP 2014-225546 A or the like, a protective sheet for semiconductor processing can be attached to a non-mounting surface excluding a mounting surface of a surface with a bump electrode.

(Processing Step)

The method for manufacturing a semiconductor device may include a processing step between the protection step and a peeling step described later.

As the processing step, any processing step used for manufacturing a known semiconductor device can be adopted without particular limitation. For example, when the protective sheet for semiconductor processing used in the protection step is used as a dicing tape of a wafer, the protective sheet for semiconductor processing is attached to the wafer having a plurality of components formed thereon in the protection step, and then a dicing step in which the wafer is cut and separated into individual components (dicing) to provide small element pieces (chips) is carried out in the processing step. When the stacking step of the semiconductor chip is carried out as the processing step, only non-mounting surfaces of the surface with a bump electrode is protected in the protection step, and the mounting surfaces having no protective sheet for semiconductor processing attached are brought into contact with each other and electrically connected while stacking one on another.

(Heating Step)

The method for manufacturing a semiconductor device includes a heating step between the protection step and the peeling step to be described later. When the method for manufacturing a semiconductor device includes the processing step after the protection step, the order of the processing step and the heating step is not limited. From a point of view of maximizing the protective function and the temporary fixing function of the protective sheet for semiconductor processing, that is, of maximizing the adhesion performance, the processing step and the heating step are preferably carried out simultaneously, or the processing step is preferably carried out before the heating step.

As the heating step, any heating step used for manufacturing a known semiconductor device can be adopted without particular limitation. Examples of the heating step include an after-curing step for a PCB with bumps, a sputtering step for a semiconductor chip, and a reflow step at the time when connecting semiconductor chips.

The conditions for the heating step are not particularly limited. When the protection step is carried out before the heating step, the surface with a bump electrode can be favorably protected, even when a treatment at high temperature such as, for example, at 150° C. or higher, at 180° C. or higher, or at 200° C. or higher is carried out. The maximum attained temperature in the heating step is not particularly limited, and is, for example, from 100 to 230° C. The upper limit temperature of the heating step is not particularly limited, but is preferably 300° C. and more preferably 270° C. from a point of view of heat resistance of the protective sheet for semiconductor processing. The heating time is not particularly limited, and is, for example, from 1 minute to 180 minutes, preferably from 1 minute to 120 minutes, and more preferably from 1 minute to 60 minutes.

(Active Energy Ray Irradiation Step)

In the active energy ray irradiation step, the protective sheet for semiconductor processing is usually irradiated with active energy rays usually through the substrate side. When an adherend has optical transparency, the protective sheet for semiconductor processing may be irradiated with active energy rays through the adherend side towards the protective sheet for semiconductor processing. The adhesive layer can be crosslinked and cured by the active energy ray irradiation, so that the heat resistance of the protective sheet for semiconductor processing can be improved, or the release property of the protective sheet for semiconductor processing can be improved. The active energy ray irradiation step is required to be carried out between the protection step and the peeling step to be described later, and the order of the processing step and the heating step is not limited.

The active energy ray irradiation step may be split into two steps. For example, when an active energy ray irradiation step is carried out between the protection step and the processing step to crosslink and cure a part of the ethylenically unsaturated group contained in the adhesive layer, the heat resistance of the protective sheet for semiconductor processing can be increased. Furthermore, when the second active energy ray irradiation step is carried out immediately before the peeling step to be described later to crosslink (completely cure) the remaining ethylenically unsaturated group, the peel strength of the protective sheet for semiconductor processing can be reduced, and the release property from the adherend can be improved.

Examples of the active energy rays include gamma rays, ultraviolet rays (UV), visible rays, infrared rays (heat rays), radio waves, alpha rays, beta rays, electron rays, plasma flows, ionizing rays, and particle rays, and among them, ultraviolet rays (UV) are preferable. As the light source used when UV irradiation is carried out on the protective sheet for semiconductor processing, before peeling, attached to an adherend, examples thereof include an LED lamp, a high-pressure mercury lamp, an ultra-high pressure mercury lamp, a carbon arc lamp, a xenon lamp, a metal halide lamp, a chemical lamp, and a black light. An LED lamp, a high-pressure mercury lamp, or a metal halide lamp is preferably used for an active energy ray irradiation.

An amount of active energy ray radiation applied to the protective sheet for semiconductor processing is preferably from 50 to 3000 mJ/cm$^2$, and more preferably from 100 to 1500 mi/cm$^2$. When the amount of active energy ray radiation applied to the protective sheet for semiconductor processing is 50 mJ/cm$^2$ or more, the adhesive layer can be cured at an adequately high curing rate by an active energy ray irradiation, and hence the adhesive force of the adhesive layer after the active energy ray irradiation can be adequately reduced. When the amount of active energy ray radiation applied to the protective sheet for semiconductor processing is more than 3000 mJ/cm$^2$, an effect commensurate with the amount of the irradiation cannot be obtained, and hence the amount of active energy ray radiation applied to the protective sheet for semiconductor processing is adjusted to 3000 mi/cm$^2$ or less, so that the ethylenically unsaturated group contained in the adhesive layer can be cured economically while reducing the influence of the irradiation of the active energy ray on the adherend.

(Peeling Step)

In the peeling step, the protective sheet for semiconductor processing is peeled off from the surface with a bump electrode and removed. The peeling step is carried out after the active energy ray irradiation has been carried out and the adhesive layer has been cured. When irradiated with active energy rays, the ethylenically unsaturated bond contained in the adhesive layer forms a three-dimensional crosslinked structure and is cured. As a result, the peel strength of the adhesive layer is reduced. Thereafter, the protective sheet for semiconductor processing is peeled off from the semiconductor device.

According to a method for manufacturing a semiconductor device having a bump electrode according to one embodiment, even when the heating step is carried out, a semiconductor device can be obtained in a state where no outgas is generated and no adhesive residue on the surface of the adherend with bumps, and thus the obtained semiconductor device can be subjected to the subsequent mounting step without issues.

EXAMPLES

Hereinafter, the present invention will be described more specifically with reference to Examples and Comparative Examples, but the present invention is not limited to the following Examples.

The raw materials used are presented below.

Alkyl (meth)acrylate (a1-1) or (a2-1):
- Methyl methacrylate, available from Nippon Shokubai Co., Ltd.
- n-Butyl acrylate, available from OSAKA ORGANIC CHEMICAL INDUSTRY LTD.
- 2-Ethylhexyl acrylate, available from OSAKA ORGANIC CHEMICAL INDUSTRY LTD. and
- Isooctyl acrylate, available from OSAKA ORGANIC CHEMICAL INDUSTRY LTD.

Hydroxy Group-Containing (meth)acrylate (a1-2) or Other Monomers (a2-4):
- 2-Hydroxyethyl acrylate, available from Nippon Shokubai Co., Ltd.

Carboxy Group-Containing Ethylenically Unsaturated Compound (a1-3) or (a2-2):
- Acrylic acid, available from Nippon Shokubai Co., Ltd. and
- Methacrylic acid, available from Nippon Shokubai Co., Ltd.

Other Monomers (a1-4):
- N,N-Dimethylacrylamide

Radical Polymerization Initiator:
- 2,2'-Azobis(isobutyronitrile), available from FUJIFILM Wako Pure Chemical Corporation Epoxy Group-Containing Ethylenically Unsaturated Compound (a2-3):
- 3,4-Epoxycyclohexylmethyl methacrylate, available from Daicel Corporation
- Glycidyl methacrylate, available from NOF CORPORATION Isocyanato Group-Containing Ethylenically Unsaturated Compound:
- Karenz (trademark) MOI (2-isocyanatoethyl methacrylate), available from Showa Denko K.K.

Crosslinking Agent (B1):
- HX (Isocyanurate of hexamethylene diisocyanate), available from Tosoh Corporation, trade name: Coronate HX
- L-45E (Tolylene diisocyanate adduct of trimethylolpropane), available from Tosoh Corporation, trade name: Coronate L-45E Crosslinking Agent (B2):
- KF-105 (both-end epoxy-modified polydimethylsiloxane), available from Shin-Etsu Chemical Co., Ltd., trade name KF-105
- TETRAD X (N,N'-[1,3-phenylenebis(methylene)]bis[bis(oxirane-2-ylmethyl)amine]), available from MITSUBISHI GAS CHEMICAL COMPANY, INC., trade name: TETRAD-X and Photopolymerization Initiator (C):

TPO (2,4,6-Trimethylbenzoyldiphenylphosphine oxide), available from BASF, trade name: L-TPO

Synthesis Example 1: Production of Ethylenically Unsaturated Group-Free (meth)acrylic Resin (A1-1)

There was prepared a mixed solution in which a monomer group (M1) containing 7 parts by mass (9.07 mol) of methyl methacrylate, 50 parts by mass (50.61 mol) of n-butyl acrylate, 35 parts by mass (24.64 mol) of 2-ethylhexyl acrylate, 10 parts by mass (13.09 mol) of N,N-dimethylacrylamide, 1.5 parts by mass (1.68 mol) of 2-hydroxyethyl acrylate, and 0.5 parts by mass (0.90 mol) of acrylic acid; and 0.1 parts by mass of 2,2'-azobis(isobutyronitrile) as a polymerization initiator per 100 parts by mass of the monomer group (M1) were contained.

Into a four-necked flask equipped with a stirrer, a dropping funnel, a cooling tube, and a nitrogen inlet tube was put 175.6 parts by mass of butyl acetate as a solvent, and the temperature was raised to 80° C. under an atmosphere of nitrogen gas. The mixed solution was added dropwise evenly over 4 hours into the four-necked flask while maintaining the reaction temperature at 80° C.±2° C., and after completion of the dropwise addition, the polymerization was carried out at a temperature of 80° C.±2° C. while continuing stirring for another 6 hours to provide a reaction solution containing an ethylenically unsaturated group-free (meth) acrylic resin (A1-1) (Weight-average molecular weight (Mw): 300,000, glass transition temperature (Tg): −42° C., acid value: 3.74 mgKOH/g, hydroxyl value: 6.97 mgKOH/g).

Synthesis Example 2: Production of Ethylenically Unsaturated Group-Containing (meth)acrylic Resin (A2-1)

There was prepared a first mixed solution in which a monomer group (M2) containing 60 parts by mass (45.82 mol) of 2-ethylhexyl acrylate, 28 parts by mass (30.74 mol) of n-butyl acrylate, and 12 parts by mass (23.44 mol) of acrylic acid; and 0.1 parts by mass of 2,2'-azobis(isobutyronitrile) as a radical polymerization initiator were contained.

Next, there was prepared a second mixed solution in which 25 parts by mass (17.93 mol) of 3,4-epoxycyclohexylmethyl methacrylate; and 1.5 parts by mass of tris(4-methylphenyl)phosphine (TPTP) as a catalyst, 100.0 parts by mass of butyl acetate and 91.1 parts by mass of toluene as a solvent, per 100 parts by mass of the sum of the monomer group (M2) used in the first mixed solution and 3,4-epoxycyclohexylmethyl methacrylate were contained.

Into a four-necked flask equipped with a stirrer, a dropping funnel, a cooling tube, and a nitrogen inlet tube was put 175.6 parts by mass of butyl acetate as a solvent, and the temperature was raised to 80° C. under an atmosphere of nitrogen gas. The first mixed solution was added dropwise evenly over 4 hours into the four-necked flask while maintaining the reaction temperature at 80° C.±2° C., and after completion of the dropwise addition, the polymerization was carried out at a temperature of 80° C.±2° C. while continuing stirring for another 6 hours to provide a carboxy group-containing copolymer. Thereafter, into the reaction system, 0.15 parts by mass of 4-methoxyphenol as a polymerization inhibitor per 100 parts by mass of the sum of the monomer group (M2) and 3,4-epoxycyclohexylmethyl methacrylate was added.

The reaction system added with 4-methoxyphenol was heated up to 100° C., and the second mixed solution was added dropwise thereto over 0.5 hours, and then stirring was continued at a temperature of 100° C. for 8 hours, and the reaction system was cooled to room temperature (23° C.) to provide a reaction solution containing an ethylenically unsaturated group-containing (meth)acrylic resin (A2-1) (Weight-average molecular weight (Mw): 350,000, glass transition temperature (Tg): −50° C., acid value: 17.55 mgKOH/g, hydroxyl value: 57.13 mgKOH/g, ethylenically unsaturated group equivalent: 981.98 g/mol).

Synthesis Example 3: Production of Ethylenically Unsaturated Group-Containing (meth)acrylic Resin (A2-2)

There was prepared a first mixed solution in which a monomer group (M2) containing 10 parts by mass (14.66 mol) of methyl methacrylate, 45 parts by mass (35.85 mol) of 2-ethylhexyl acrylate, 30 parts by mass (29.90 mol) of isooctyl acrylate, and 15 parts by mass (25.58 mol) of methacrylic acid; and 0.1 parts by mass of 2,2'-azobis(isobutyronitrile) as a radical polymerization initiator were contained.

Next, there was prepared a second mixed solution in which 20 parts by mass (20.66 mol) of glycidyl methacrylate; and 1.5 parts by mass of tris(4-methylphenyl)phosphine (TPTP) as a catalyst, 100 parts by mass of butyl acetate and 91.1 parts by mass of toluene as a solvent, per 100 parts by mass of the sum of the monomer group (M2) used in the first mixed solution and glycidyl methacrylate were contained.

Into a four-necked flask equipped with a stirrer, a dropping funnel, a cooling tube, and a nitrogen inlet tube was put 175.6 parts by mass of butyl acetate as a solvent, and the temperature was raised to 80° C. under an atmosphere of nitrogen gas. The first mixed solution was added dropwise evenly over 4 hours into the four-necked flask while maintaining the reaction temperature at 80° C.±2° C., and after completion of the dropwise addition, the polymerization was carried out at a temperature of 80° C.±2° C. while continuing stirring for another 6 hours to provide a carboxy group-containing copolymer. Thereafter, into the reaction system, 0.15 parts by mass of 4-methoxyphenol as a polymerization inhibitor per 100 parts by mass of the sum of the monomer group (M2) and glycidyl methacrylate was added.

The reaction system added with 4-methoxyphenol was heated up to 100° C., and the second mixed solution was added dropwise thereto over 0.5 hours, and then stirring was continued at a temperature of 100° C. for 8 hours, and the reaction system was cooled to room temperature (23° C.) to provide a reaction solution containing an ethylenically unsaturated group-containing (meth)acrylic resin (A2-2) (Weight-average molecular weight (Mw): 400,000, glass transition temperature (Tg): −35° C., acid value: 15.67 mgKOH/g, hydroxyl value: 65.72 mgKOH/g, ethylenically unsaturated group equivalent: 853.61 g/mol).

Comparative Synthesis Example 1: Production of Ethylenically Unsaturated Group-Containing (meth)acrylic Resin (cA2-1)

There was prepared a mixed solution in which a monomer group (M1) containing 5 parts by mass (6.63 mol) of methyl methacrylate, 50 parts by mass (51.79 mol) of n-butyl acrylate, 25 parts by mass (18.01 mol) of 2-ethylhexyl acrylate, 19 parts by mass (21.73 mol) of 2-hydroxyethyl acrylate, and 1 part by mass (1.84 mol) of acrylic acid; and 0.1 parts by mass of 2,2'-azobis(isobutyronitrile) as a radical polymerization initiator were contained.

Into a four-necked flask equipped with a stirrer, a dropping funnel, a cooling tube, and a nitrogen inlet tube was put 175.6 parts by mass of butyl acetate as a solvent, and the temperature was raised to 80° C. under an atmosphere of nitrogen gas. The mixed solution was added dropwise evenly over 4 hours into the four-necked flask while maintaining the reaction temperature at 80° C.±2° C., and after completion of the dropwise addition, the polymerization was carried out at a temperature of 80° C.±2° C. while continuing stirring for another 6 hours. Next, the temperature of the reaction product was lowered to 60° C., and a mixed solution of 20 parts by mass (17.12 mol) of 2-isocyanatoethyl methacrylate, 0.1 parts by mass of dibutyltin dilaurate as an urethanization catalyst, and 200 parts by mass of ethyl acetate was added dropwise through the dropping funnel thereto. After completion of the dropwise addition, the reaction system was held at 70° C. for 4 hours to eliminate the isocyanato group, and thus a reaction solution containing an ethylenically unsaturated group-containing (meth)acrylic resin (cA2-1) (Weight-average molecular weight (Mw): 400,000, glass transition temperature (Tg): −25° C., acid value: 6.48 mgKOH/g, hydroxyl value: 16.22 mgKOH/g, ethylenically unsaturated group equivalent: 931.68 g/mol) was obtained.

TABLE 1

| | | | | Synthesis Example 1 A1-1 |
|---|---|---|---|---|
| Composition | Alkyl (meth)acrylate (a1-1) | Methyl methacrylate | mol % | 9.07 |
| | | n-Butyl acrylate | | 50.61 |
| | | 2-Ethylhexyl acrylate | | 24.64 |
| | Hydroxy group-containing (meth)acrylate (a1-2) | 2-Hydroxyethyl acrylate | | 1.68 |
| | Carboxy group-containing ethylenically unsaturated compound (a1-3) | Acrylic acid | | 0.90 |
| | Other monomers (a1-4) | N,N-Dimethylacrylamide | | 13.09 |
| | Total | | | 100 |
| | Radical polymerization initiator | 2,2'-Azobis(isobutyronitrile) | parts by mass *1 | 0.1 |
| Hydroxyl value | | | mgKOH/g | 6.97 |
| Acid value | | | mgKOH/g | 3.74 |
| Mw | | | — | 300000 |
| Tg | | | ° C. | −42 |

*1 Parts by mass per 100 parts by mass of the monomer

TABLE 2

| | | | | Synthesis Example 2 A2-1 | Synthesis Example 3 A2-2 | Comparative Synthesis Example 1 cA2-1 |
|---|---|---|---|---|---|---|
| Composition | Alkyl (meth)acrylate (a2-1) | Methyl methacrylate | mol % | — | 14.66 | 6.63 |
| | | 2-Ethylhexyl acrylate | | 45.82 | 35.85 | 18.01 |
| | | n-Butyl acrylate | | 30.74 | — | 51.79 |
| | | Isooctyl acrylate | | — | 23.90 | — |
| | Carboxy group-containing ethylenically unsaturated compound (a2-2) | Acrylic acid | | 23.44 | — | 1.84 |
| | | Methacrylic acid | | — | 25.58 | — |
| | Other monomers (a2-4) | 2-Hydroxyethyl acrylate | | — | — | 21.73 |
| | Total | | | 100 | 100 | 100 |
| | Radical polymerization initiator | 2,2'-Azobis(isobutyronitrile) | parts by mass *1 | 0.1 | 0.1 | 0.1 |
| | Epoxy group-containing ethylenically unsaturated compound (a2-3) | 3,4-Epoxycyclohexylmethyl methacrylate | mol *2 | 17.93 | — | — |
| | | Glycidyl methacrylate | | — | 20.66 | — |
| | Isocyanato group-containing ethylenically unsaturated compound | 2-isocyanatoethyl methacrylate | | — | — | 17.12 |
| Ethylenically unsaturated group equivalent | | | g/mol | 981.98 | 853.61 | 931.68 |
| Hydroxyl value | | | mgKOH/g | 57.13 | 65.72 | 16.22 |
| Acid value | | | mgKOH/g | 17.55 | 15.67 | 6.48 |
| Mw | | | — | 350000 | 400000 | 400000 |
| Tg | | | ° C. | −50 | −35 | −25 |

*1 Parts by mass per 100 parts by mass of the monomer
*2 Number of moles per 100 moles of the monomer (Production of Uncured Intermediate Layer (X1-1))

Ethyl acetate as a dilution solvent was added to the reaction solution containing the ethylenically unsaturated group-free (meth)acrylic resin (A1-1) (also simply referred to as the resin (A1-1)) obtained in Synthesis Example 1 to provide a resin (A1-1) solution in which the content of the resin (A1-1) was 30% by mass. Using the resin (A1-1) solution, a resin composition (X1) for an intermediate layer was obtained by the following method.

In a room where active rays were blocked, the ethylenically unsaturated group-free (meth)acrylic resin (A1-1) and HX as a crosslinking agent (B1) were added into a plastic container in blending amounts (in parts by mass) listed in Table 3, and stirred to provide a resin composition (X1) for an intermediate layer. The numerical value of the ethylenically unsaturated group-free (meth)acrylic resin (A1) (also referred to as resin (A1)) in Table 3 is the solid content of the resin (A1) solution in which the content of the resin (A1) is 30% by mass, that is, the amount (in parts by mass) of the resin (A1) used. The numerical value of the crosslinking agent (B1) is the blending amount (in parts by mass) per 100 parts by mass of the resins (A1).

The resin composition (X1) was applied as is onto a substrate so the film thickness after thermal curing as to be 125 μm, and heat-dried at 100° C. for 5 minutes to form an uncured intermediate layer (X1-1). Thereafter, a release sheet was attached onto the uncured intermediate layer (X1-1). As the substrate, a polyamide (PA) film (EX-25, available from UNITIKA LTD.) having a thickness of 25 μm was used. As the release sheet, a polyethylene terephthalate (PET) film (E5100, available from HIGASHIYAMA FILM CO., LTD.) having a thickness of 25 μm was used. Note that, the measurement of the film thickness after thermal curing was carried out for an intermediate layer (X1-1) obtained by curing the uncured intermediate layer (X1-1) at 40° C. for 3 days in an oven.

(Production of Uncured Intermediate Layer (X1-2))

An uncured intermediate layer (X1-2) having a release sheet attached thereon was obtained in the similar manner to the production of the uncured intermediate layer (X1-1) except that the film thickness after thermal curing was 35 μm and a polyethylene terephthalate (PET) film (E5107, available from HIGASHIYAMA FILM CO., LTD.) having a thickness of 25 μm was used as a substrate, and furthermore the measurement of the film thickness after thermal curing was carried out.

(Production of Uncured Intermediate Layer (X2-1))

A resin composition (X2) was obtained in the similar manner to the production of the resin composition (X1) except that raw materials and blending amounts listed in Table 3 were used. An uncured intermediate layer (X2-1) having a release sheet attached thereon was obtained in the similar manner to the production of the uncured intermediate layer (X1-1) except that the resin composition (X2) was used in place of the resin composition (X1), and furthermore the measurement of the film thickness after thermal curing was carried out.

(Production of Uncured Intermediate Layer (X2-2))

An uncured intermediate layer (X2-2) having a release sheet attached thereon was obtained in the similar manner to the production of the uncured intermediate layer (X2-1) except that the film thickness after thermal curing was 90 μm and a polyethylene terephthalate (PET) film (E5107, available from HIGASHIYAMA FILM CO., LTD.) having a thickness of 25 μm was used as the substrate, and furthermore the measurement of the film thickness after thermal curing was carried out.

(Production of Uncured Intermediate Layer (X2-3))

An uncured intermediate layer (X2-3) having a release sheet attached thereon was obtained in the similar manner to the production of the uncured intermediate layer (X2-1) except that the film thickness after thermal curing was 80 μm and a polyethylene naphthalate (PEN) film (Teonex Q51, available from TOYOBO CO., LTD.) having a thickness of 25 μm was used as the substrate, and furthermore the measurement of the film thickness after thermal curing was carried out.

(Production of Intermediate Layer (X3))

A single screw extruder (Single screw extruder, available from TECHNOVEL CORPORATION) was used to extrude and deposit an ethylene-vinyl acetate copolymer (having a melting point of 70° C., product name: EVAFLEX (trademark) EV150, available from DOW-MITSUI POLYCHEMICALS CO., LTD.) so as to have a thickness of 125 μm on a polyamide (PA) film (EX-25, available from UNITIKA LTD.) having a thickness of 25 μm to form an intermediate layer (X3). A release sheet (25 μm polyethyleneterephthalate (PET) film (E7006, available from HIGASHIYAMA FILM CO., LTD.)) was attached onto the formed intermediate layer (X3).

TABLE 3

(numerical values are in parts by mass)

| | | X1 | X2 | X3 |
|---|---|---|---|---|
| Ethylenically unsaturated group-free (meth)acrylic resin (A1) | A1-1 | 100 | 100 | — |
| Crosslinking agent (B1) | HX | 0.2 | — | — |
| | L-45E | — | 0.5 | — |
| Ethylene-vinyl acetate copolymer | EVAFFLEX EV150 | — | — | 100 |

(Production of Uncured Adhesive Layer (Y1-1))

Ethyl acetate as a dilution solvent was added to the reaction solution containing the ethylenically unsaturated group-containing (meth)acrylic resin (A2-1) (also simply referred to as the resin (A2-1)) obtained in Synthesis Example 2 to provide a resin (A2-4) solution in which the content of the resin (A2-1) was 30% by mass. Using the resin (A2-1) solution, an adhesive composition (Y1) for an adhesive layer was obtained by the following method.

In a room where active rays were blocked, the ethylenically unsaturated group-containing (meth)acrylic resin (A2-1), KF-105 as a crosslinking agent (B2), and TPO as a photopolymerization initiator (C) were added into a plastic container in blending amounts (in parts by mass) listed in Table 4, and stirred to provide an adhesive composition (Y1) for an adhesive layer.

The numerical value of the ethylenically unsaturated group-containing (meth)acrylic resin (A2) (also simply referred to as the resin (A2)) in Table 4 is the solid content of the resin (A2) solution in which the content of the resin (A2) is 30% by mass, that is, the amount (in parts by mass) of the resin (A2) used. The numerical values of the crosslinking agent (B2) and of the photopolymerization initiator (C) are the blending amounts (in parts by mass) per 100 parts by mass of the resin (A2).

The adhesive composition (Y1) was applied as is onto a release sheet so the film thickness after thermal curing as to be 25 μm, and heat-dried at 100° C. for 2 minutes to form an uncured adhesive layer (Y1-1). Thereafter, a release sheet was attached onto the uncured adhesive layer (Y1-1). As the release sheet, a polyethylene terephthalate (PET) film (E7006, available from HIGASHIYAMA FILM CO., LTD.) having a thickness of 25 μm was used. Note that the measurement of the film thickness after thermal curing was carried out for the adhesive layer (Y1-1) obtained by curing the uncured adhesive layer (Y1-1) at 40° C. for 3 days in an oven.

(Production of Uncured Adhesive Layer (Y1-2))

An uncured adhesive layer (Y1-2) having a release sheet attached thereon was obtained in the similar manner to the production of the uncured adhesive layer (Y1-1) except that the film thickness after thermal curing was 15 μm, and furthermore the measurement of the film thickness after thermal curing was carried out.

(Production of Uncured Adhesive Layer (Y1-3))

An uncured adhesive layer (Y1-3) having a release sheet attached thereon was obtained in the similar manner to the production of the uncured adhesive layer (Y1-1) except that the film thickness after thermal curing was 10 μm, and furthermore the measurement of the film thickness after thermal curing was carried out.

(Production of Uncured Adhesive Layer (Y1-4))

The adhesive composition (Y1) obtained in the production of the uncured adhesive layer (Y1-1) was applied as is onto a polyamide (PA) film (EX-25, available from UNITIKA LTD.) having a thickness of 25 μm so the film thickness after thermal curing as to be 150 μm, and heat-dried at 100° C. for 2 minutes to form an uncured adhesive layer (Y1-4). Thereafter, a release sheet was attached onto the uncured adhesive layer (Y1-4). As the release sheet, a polyethylene terephthalate (PET) film (E7006, available from HIGASHIYAMA FILM CO., LTD.) having a thickness of 25 μm was used. Note that the measurement of the film thickness after thermal curing was carried out for the adhesive layer (Y1-4) obtained by curing the uncured adhesive layer (Y1-4) at 40° C. for 3 days in an oven.

(Production of Uncured Adhesive Layer (Y2-1))

An adhesive composition (Y2) was obtained in the similar manner to the production of the adhesive composition (Y1) except that the raw materials and the blending amounts listed in Table 4 were used. An uncured adhesive layer (Y2-1) having a release sheet attached thereon was obtained in the similar manner to the production of the uncured adhesive layer (Y1-1) except that the adhesive composition (Y2) was used in place of the adhesive composition (Y1), and furthermore the measurement of the film thickness after thermal curing was carried out.

(Production of Uncured Adhesive Layer (Y2-2))

An uncured adhesive layer (Y2-2) having a release sheet attached thereon was obtained in the similar manner to the production of the uncured adhesive layer (Y2-1) except that the film thickness after thermal curing was 20 μm, and furthermore the measurement of the film thickness after thermal curing was carried out.

(Production of Uncured Adhesive Layer (Y2-3))

An uncured adhesive layer (Y2-3) having a release sheet attached thereon was obtained in the similar manner to the production of the uncured adhesive layer (Y1-4) except that the adhesive composition (Y2) obtained in the production of the uncured adhesive layer (Y2-1) was used in place of the adhesive composition (Y1), and furthermore the measurement of the film thickness after thermal curing was carried out.

(Production of Uncured Adhesive Layer (Y3))

An adhesive composition (Y3) was obtained in the similar manner to the production of the adhesive composition (Y1) except that the raw materials and the blending amounts listed in Table 4 were used. An uncured adhesive layer (Y3) having a release sheet attached thereon was obtained in the similar manner to the production of the uncured adhesive layer (Y1-1) except that the adhesive composition (Y3) was used in place of the adhesive composition (Y1), and furthermore the measurement of the film thickness after thermal curing was carried out.

TABLE 4

(numerical values are in parts by mass)

| | | Y1 | Y2 | Y3 |
|---|---|---|---|---|
| Ethylenically unsaturated group-containing (meth) Acrylic resin (A2) | A2-1 | 100 | — | — |
| | A2-2 | — | 100 | — |
| | cA2-1 | — | — | 100 |
| Crosslinking agent (B2) | KF-105 | 0.9 | — | — |
| | TETRAD X | — | 0.3 | 0.1 |
| Photopolymerization initiator (C) | TPO | 0.5 | 0.5 | 0.5 |

[Example 1] (Production of Protective Sheet for Semiconductor Processing)

The release sheet was peeled off from the uncured intermediate layer (X1-1) having the release sheet attached thereon, the release sheet was peeled off from one surface of the uncured adhesive layer (Y1-1) having the release sheet attached thereon, and the two layers were attached to each other with the exposed surfaces facing each other. Thereafter, curing was carried out in an oven at 40° C. for 3 days to crosslink and cure the uncured intermediate layer (X1-1) and the uncured adhesive layer (Y1-1) thereby giving a protective sheet for semiconductor processing of Example 1.

Examples 2 to 7, Comparative Example 4

A protective sheet for semiconductor processing was obtained in the similar manner to Example 1 except that the uncured intermediate layer and the uncured adhesive layer described in Table 5 were used.

Comparative Example 1

The uncured adhesive layer (Y1-4) was cured in an oven at 40° C. for 3 days and the uncured adhesive layer (Y1-4) was crosslinked and cured thereby giving a protective sheet for semiconductor processing of Comparative Example 1.

Comparative Example 2

The uncured adhesive layer (Y2-3) was cured in an oven at 40° C. for 3 days and the uncured adhesive layer (Y2-3) was crosslinked and cured thereby giving a protective sheet for semiconductor processing of Comparative Example 2.

Comparative Example 3

The release sheet was peeled off from the intermediate layer (X3) having the release sheet attached thereon, the release sheet was peeled off from one surface of the uncured adhesive layer (Y1-1) having the release sheet attached thereon, and the two layers were attached to each other with the exposed surfaces facing each other. Thereafter, curing was carried out in an oven at 40° C. for 3 days to crosslink and cure the uncured adhesive layer (Y1-1) thereby giving a protective sheet for semiconductor processing of Comparative Example 3.

The obtained protective sheets for semiconductor processing were subjected to the evaluation of the following items according to the following method. The results are presented in Table 5.

[Peel Strength Before UV Irradiation]

The protective sheet for semiconductor processing was cut into a size of 25 mm in length and 100 mm in width, and the release sheet was peeled off therefrom to expose the adhesive layer. Next, the protective sheet for semiconductor processing was attached onto a glass plate so the exposed adhesive layer (measurement surface) as to be in contact with the glass plate, and a 2 kg rubber roller (width: about 50 mm) was allowed to go back and forth once to provide a measurement sample for the peel strength before UV irradiation.

The obtained measurement sample was allowed to stand for 24 hours in an environment of a temperature of 23° C. and a humidity of 50%. Thereafter, a tensile tester (Texture Analyzer, available from EKO INSTRUMENTS CO., LTD.) was used to carry out a tensile test in the 180° direction at a peeling rate of 300 mm/min under an environment of a temperature of 23° C. and a humidity of 50% according to JIS Z 0237:2009, and the peel strength (in N/25 mm) of the adhesive sheet to the glass plate was measured.

[Peel Strength after UV Irradiation]

A sample same as the measurement sample for the peel strength before UV irradiation was prepared, and ultraviolet rays (UV) at an irradiation amount of 1000 mJ/cm$^2$ was applied through the surface on the side of the protective sheet for semiconductor processing to provide a measurement sample for the peel strength after UV irradiation. A conveyor type ultraviolet irradiation device (available EYE GRAPHICS COMPANY, 2 KW lamp, 80 W/cm) was used for UV irradiation.

The obtained measurement sample was subjected to the measurement of the peel strength (N/25 mm) of the adhesive sheet to a glass plate in the similar manner to [Peel strength before UV irradiation].

[Step Height Filling Property: Mounting Step]

The release sheet was peeled off from the protective sheet for semiconductor processing to expose the adhesive layer. Next, the exposed adhesive layer and a PCB with bumps (Bump diameter φ=20 μm, distance between bumps was 30 μm, bump height was 45, 80, 100, or 120 μm) were treated at 40° C. for 5 minutes and attached to each other by using a mounter (available from Hugle Electronics Inc., HS7800) to provide a sample for process test. This sample was observed from the side of the protective sheet for semiconductor processing with an optical microscope, and step height filling property (in mounting step) was evaluated and rated as "excellent" if air bubbles contained area was 1% or less of the entire area of PCB with bumps, as "good" if air bubbles contained area was more than 1% and less than 10%, and as "poor" if air bubbles contained area was 10% or more.

[Step Height Filling Property: Dicing Step]

The sample for process test obtained in the mounting step was diced with a blade (SDC200 R100NMR, kerf width: 0.3 mm, blade rotation speed: 28000 rpm, cutting speed: 30 mm/sec, cutting depth: 100 μm, available from TOKYO SEIMITSU CO., LTD.) to provide a fragmented sample for process test. This sample was irradiated with UV under the condition of 50 mJ/cm$^2$ to partially cure the adhesive layer. A conveyor type ultraviolet irradiation device (available EYE GRAPHICS COMPANY, 2 KW lamp, 80 W/cm) was used for UV irradiation. The UV-irradiated sample was observed with an optical microscope from the side of the protective sheet for semiconductor processing, and the step height filling property (in dicing step) was evaluated and rated as "excellent" if air bubbles contained area was 1% or less of the entire area of PCB with bumps, as "good" if air bubbles contained area was more than 1% and less than 10%, and as "poor" if air bubbles contained area was 10% or more.

[Step Height Filling Property: Heating Step]

The fragmented sample for process test, which had been obtained in the dicing step, was heat treated at 200° C. for 2 hours. This sample was allowed to cool and then observed from the side of the protective sheet for semiconductor processing with an optical microscope, and the step height filling properties (in heating step) was evaluated and rated as "excellent" if air bubbles contained area was 1% or less of the entire area of PCB with bumps, as "good" if air bubbles contained area was more than 1% and less than 10%, and as "poor" if air bubbles contained area was 10% or more.

[Adhesive Residue]

The fragmented sample for process test, which had been heat treated in heating step, was irradiated with UV under the condition of 1000 mJ/cm$^2$ through the side of the surface on the protective sheet for semiconductor processing so that the adhesive layer was completely cured. A conveyor type ultraviolet irradiation device (available EYE GRAPHICS COMPANY, 2 KW lamp, 80 W/cm) was used for UV irradiation. Thereafter, the protective sheet for semiconductor processing was peeled off, and the surface of the PCB with bumps on the side to which the sheet was attached was observed with an optical microscope, and evaluated as "excellent" if no adhesive residue was observed, as "good" if the residual adhesive was deposited in an area of less than 10% of the entire area, and as "poor" if the residual adhesive was deposited in an area of 10% or more of the entire area.

[Substrate Fracture]

The fragmented sample for process test, which had been obtained in the dicing step, was heat treated at 200° C. for 2 hours. The situation after the heat treatment was checked, and the substrate fracture was evaluated as "excellent" if no fracture (rupture, hole opening, and warping) of the substrate was observed at all, as "good" if fracture of the substrate was observed in an area of less than 5% of the entire area, and as "poor" if fracture of the substrate was observed in an area of 5% or more of the entire area.

TABLE 5

| | | Ex. 1 | Ex. 2 | Ex. 3 | Ex. 4 | Ex. 5 | Ex. 6 |
|---|---|---|---|---|---|---|---|
| Substrate | | PA | PA | PA | PA | PET | PET |
| Uncured intermediate layer (X) *[1] | | X1-1 | X1-1 | X2-1 | X2-1 | X1-2 | X2-2 |
| Uncured adhesive layer (Y) | | Y1-1 | Y2-1 | Y1-1 | Y2-1 | Y1-2 | Y1-3 |
| Film thickness | substrate (μm) | 25 | 25 | 25 | 25 | 25 | 25 |
| | Iintermediate layer (μm) | 125 | 125 | 125 | 125 | 35 | 90 |
| | Adhesive layer (μm) | 25 | 25 | 25 | 25 | 15 | 10 |

TABLE 5-continued

| | | | | | | | | |
|---|---|---|---|---|---|---|---|---|
| | Peel strength | Before UV irradiation (N/25 mm) | 9.9 | 8.5 | 10 | 7.5 | 8.8 | 10.5 |
| | | After UV irradiation (N/25 mm) | 0.02 | 0.03 | 0.01 | 0.05 | 0.03 | 0.05 |
| 45 μm bump | | d/H | 3.33 | 3.33 | 3.33 | 3.33 | 1.11 | 2.22 |
| | Step height filling property | Mounting step | Excellent | Excellent | Excellent | Excellent | Excellent | Excellent |
| | | Dicing step | Excellent | Excellent | Excellent | Excellent | Excellent | Excellent |
| | | Heating step | Excellent | Excellent | Excellent | Excellent | Excellent | Excellent |
| | Adhesive residue | | Excellent | Excellent | Excellent | Excellent | Excellent | Excellent |
| 80 μm bump | | d/H | 1.88 | 1.88 | 1.88 | 1.88 | 0.63 | 1.25 |
| | Step height filling property | Mounting step | Excellent | Excellent | Excellent | Excellent | Good | Excellent |
| | | Dicing step | Excellent | Excellent | Excellent | Excellent | Good | Excellent |
| | | Heating step | Excellent | Excellent | Excellent | Excellent | Good | Excellent |
| | Adhesive residue | | Excellent | Excellent | Excellent | Excellent | Excellent | Excellent |
| 100 μm bump | | d/H | 1.50 | 1.50 | 1.50 | 1.50 | 0.50 | 1.00 |
| | Step height filling property | Mounting step | Excellent | Excellent | Excellent | Excellent | Good | Excellent |
| | | Dicing step | Excellent | Excellent | Excellent | Excellent | Good | Excellent |
| | | Heating step | Excellent | Excellent | Excellent | Excellent | Good | Excellent |
| | Adhesive residue | | Excellent | Excellent | Excellent | Excellent | Excellent | Excellent |
| 120 μm bump | | d/H | 1.25 | 1.25 | 1.25 | 1.25 | 0.42 | 0.83 |
| | Step height filling property | Mounting step | Excellent | Excellent | Excellent | Excellent | Good | Good |
| | | Dicing step | Excellent | Excellent | Excellent | Excellent | Good | Good |
| | | Heating step | Excellent | Excellent | Excellent | Excellent | Good | Good |
| | Adhesive residue | | Excellent | Excellent | Excellent | Excellent | Excellent | Excellent |
| Substrate fracture | | | Excellent | Excellent | Excellent | Excellent | Good | Good |

| | | | Ex. 7 | Comp. Ex. 1 | Comp. Ex. 2 | Comp. Ex. 3 | Comp. Ex. 4 |
|---|---|---|---|---|---|---|---|
| Substrate | | | PEN | PA | PA | PA | PA |
| Uncured intermediate layer (X) *[1] | | | X2-3 | — | — | X3 | X1-1 |
| Uncured adhesive layer (Y) | | | Y2-2 | Y1-4 | Y2-3 | Y1-1 | Y3 |
| Film thickness | | substrate (μm) | 25 | 25 | 25 | 25 | 25 |
| | | Iintermediate layer (μm) | 80 | 0 | 0 | 125 | 125 |
| | | Adhesive layer (μm) | 20 | 150 | 150 | 25 | 25 |
| Peel strength | | Before UV irradiation (N/25 mm) | 12.5 | 8.8 | 9.1 | 8.1 | 8.5 |
| | | After UV irradiation (N/25 mm) | 0.01 | 0.02 | 0.02 | 0.02 | 0.02 |
| 45 μm bump | | d/H | 2.22 | 3.33 | 3.33 | 3.33 | 3.33 |
| | Step height filling property | Mounting step | Excellent | Excellent | Excellent | Excellent | Excellent |
| | | Dicing step | Excellent | Excellent | Excellent | Excellent | Excellent |
| | | Heating step | Excellent | Excellent | Excellent | Excellent | Excellent |
| | Adhesive residue | | Excellent | Excellent | Excellent | Excellent | Excellent |
| 80 μm bump | | d/H | 1.25 | 1.88 | 1.88 | 1.88 | 1.88 |
| | Step height filling property | Mounting step | Excellent | Good | Good | Excellent | Excellent |
| | | Dicing step | Excellent | Good | Good | Excellent | Excellent |
| | | Heating step | Excellent | Good | Good | Excellent | Excellent |
| | Adhesive residue | | Excellent | Excellent | Excellent | Poor | Poor |
| 100 μm bump | | d/H | 1.00 | 1.50 | 1.50 | 1.50 | 1.50 |
| | Step height filling property | Mounting step | Excellent | Good | Good | Good | Excellent |
| | | Dicing step | Excellent | Poor | Poor | Excellent | Excellent |
| | | Heating step | Excellent | Poor | Poor | Excellent | Excellent |
| | Adhesive residue | | Excellent | Excellent | Excellent | Poor | Poor |
| 120 μm bump | | d/H | 0.83 | 1.25 | 1.25 | 1.25 | 1.25 |
| | Step height filling property | Mounting step | Excellent | Poor | Poor | Good | Excellent |
| | | Dioing step | Excellent | Poor | Poor | Excellent | Excellent |
| | | Heating step | Excellent | Poor | Poor | Excellent | Excellent |
| | Adhesive residue | | Excellent | Excellent | Excellent | Poor | Poor |
| Substrate fracture | | | Excellent | Excellent | Excellent | Excellent | Excellent |

*[1] Intermediate layer (X) for X3

In Examples 1 to 7, the step height filling properties were all excellent or good for the bumps of each height, and the adhesive residue was all excellent. In contrast, in Comparative Examples 1 and 2 having no intermediate layer, the step height filling properties were deteriorated as the height of the bump was increased. In Comparative Examples 3 and 4, the step height filling properties were excellent or good, but adhesive residues were all poor.

INDUSTRIAL APPLICABILITY

According to the present disclosure, it is possible to provide a protective sheet for semiconductor processing, which is capable of accurately conforming to and being in close contact with unevenness on a surface of an adherend, even when the step height (bump height) of the unevenness on the surface of the adherend is large and even when undergoing a process of treatment at high temperature, such as 200° C.

REFERENCE SIGNS LIST

12 Substrate
14 Intermediate layer
16 Adhesive layer
18 Release sheet
10 Protective sheet for semiconductor processing

The invention claimed is:

1. A protective sheet for semiconductor processing, including: a substrate; and an intermediate layer and an adhesive layer in this order on one main surface of the substrate, the intermediate layer being a cured product of a resin composition containing an ethylenically unsaturated group-free (meth)acrylic resin (A1) and a crosslinking agent (B1), and the adhesive layer being a cured product of an adhesive composition containing an ethylenically unsaturated group-containing (meth)acrylic resin (A2), a crosslinking agent (B2), and a photopolymerization initiator (C), wherein the ethylenically unsaturated group-free (meth) acrylic resin (A1) has a plurality of functional groups that reacts with a functional group included in the crosslinking agent (B1), the ethylenically unsaturated group-containing (meth) acrylic resin (A2) has a plurality of functional groups that reacts with a functional group included in the crosslinking agent (B2), and the ethylenically unsaturated group-containing (meth) acrylic resin (A2) is an adduct of an epoxy group-containing ethylenically unsaturated compound (a2-3) to a copolymer of a monomer group (M2) that contains an alkyl (meth)acrylate (a2-1) and a carboxy group-containing ethylenically unsaturated compound (a2-2).

2. The protective sheet for semiconductor processing according to claim 1, wherein the intermediate layer has a thickness of from 30 to 600 μm, the adhesive layer has a thickness of from 5 to 100 μm, and a thickness ratio between the intermediate layer and the adhesive layer (intermediate layer/adhesive layer) is from 1 to 50.

3. The protective sheet for semiconductor processing according to claim 1, wherein the ethylenically unsaturated group-free (meth)acrylic resin (A1) has a glass transition temperature (Tg) of from −80 to 0° C.

4. The protective sheet for semiconductor processing according to claim 1, wherein the ethylenically unsaturated group-free (meth)acrylic resin (A1) is a copolymer of a monomer group (M1) containing an alkyl (meth)acrylate (a1-1) and a hydroxy group-containing (meth)acrylate (a1-2), and the crosslinking agent (B1) is an isocyanate crosslinking agent.

5. The protective sheet for semiconductor processing according to claim 4, wherein the monomer group (M1) further contains a carboxy group-containing ethylenically unsaturated compound (a1-3).

6. The protective sheet for semiconductor processing according to claim 4, wherein the monomer group (M1) further contains a (meth)acrylamide compound.

7. The protective sheet for semiconductor processing according to claim 1, wherein the ethylenically unsaturated group-containing (meth)acrylic resin (A2) has a glass transition temperature (Tg) of from −80 to 0° C.

8. The protective sheet for semiconductor processing according to claim 1, wherein the ethylenically unsaturated group-containing (meth)acrylic resin (A2) has an ethylenically unsaturated group equivalent of from 100 to 4000 g/mol.

9. The protective sheet for semiconductor processing according to claim 1, wherein the crosslinking agent (B2) is an epoxy crosslinking agent.

10. A method for manufacturing a semiconductor device having a bump electrode, the method including:

a protection step of attaching a surface of the adhesive layer of the protective sheet for semiconductor processing according to claim 1 to a surface with a bump electrode of the semiconductor device;

an active energy ray irradiation step of irradiating the protective sheet for semiconductor processing with an active energy ray to photo-cure the adhesive layer;

a heating step of heating the semiconductor device having the protective sheet for semiconductor processing attached; and a peeling step of peeling the protective sheet for semiconductor processing off from the surface with a bump electrode.

11. The method for manufacturing a semiconductor device according to claim 10, wherein when a height of the bump electrode is denoted by H [μm] and a total thickness of the intermediate layer and the adhesive layer is denoted by d [μm], d/H is from 0.40 to 110.

12. The method for manufacturing a semiconductor device according to claim 10, wherein a maximum attained temperature in the heating step is from 100 to 230° C.

* * * * *